United States Patent
Yuan et al.

(10) Patent No.: US 9,552,251 B2
(45) Date of Patent: Jan. 24, 2017

(54) NEIGHBORING WORD LINE PROGRAM DISTURB COUNTERMEASURE FOR CHARGE-TRAPPING MEMORY

(71) Applicant: SanDisk Technologies Inc., Plano, TX (US)

(72) Inventors: Jiahui Yuan, Fremont, CA (US); Yingda Dong, San Jose, CA (US); Jian Chen, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 122 days.

(21) Appl. No.: 14/258,255

(22) Filed: Apr. 22, 2014

(65) Prior Publication Data
US 2015/0301885 A1    Oct. 22, 2015

(51) Int. Cl.
*G06F 11/10*    (2006.01)
*G11C 16/26*    (2006.01)
(Continued)

(52) U.S. Cl.
CPC ....... *G06F 11/1004* (2013.01); *G11C 11/5642* (2013.01); *G11C 16/0466* (2013.01);
(Continued)

(58) Field of Classification Search
CPC .............. G06F 11/1048; G06F 11/3466; G06F 2201/88; G06F 11/1004; G11C 16/26; G11C 11/5628; G11C 16/34; G11C 11/5642; G11C 16/0483; G11C 16/0466; G11C 16/3427; G11C 16/10; H01L 27/11582
See application file for complete search history.

(56) References Cited

U.S. PATENT DOCUMENTS 6,829,167 B2    12/2004    Tu et al.
7,561,469 B2    7/2009    Aritome
(Continued)

FOREIGN PATENT DOCUMENTS

WO    WO 2008/083196 A2 *    7/2008    ............ G11C 16/26
WO    WO2008/083196 A2    7/2008

OTHER PUBLICATIONS

Article 19 Amendment dated Jul. 27, 2015, International Application No. PCT/US2015/024273.
(Continued)

*Primary Examiner* — Albert Decady
*Assistant Examiner* — Kyle Vallecillo
(74) *Attorney, Agent, or Firm* — Vierra Magen Marcus LLP

(57) ABSTRACT

Techniques for reading data from memory cells arranged along a common charge trapping layer. One example is in a 3D stacked non-volatile memory device. Memory cells on a word line layer WLLn can be disturbed by programming of memory cells on an adjacent word line layer WLLn+1, resulting in uncorrectable errors. The memory cells on WLLn are read in a data recovery read operation which applies an elevated pass voltage to WLLn+1. The elevated pass voltage decreases and narrows the threshold voltages on WLLn, which facilitates reading. The data recovery read operation compensates for the lower threshold voltages of the cells by lowering the control gate voltage, raising the source voltage or adjusting a sensing period, demarcation level or pre-charge level in sensing circuitry. The elevated pass voltage can be stepped up in repeated read attempts until there are no uncorrectable errors or a limit is reached.

19 Claims, 27 Drawing Sheets

(51) Int. Cl.
*G11C 16/10* (2006.01)
*G11C 16/04* (2006.01)
*G11C 11/56* (2006.01)
*G11C 16/34* (2006.01)
*H01L 27/115* (2006.01)

(52) U.S. Cl.
CPC .............. *G11C 16/10* (2013.01); *G11C 16/26* (2013.01); *G11C 16/3427* (2013.01); *H01L 27/11582* (2013.01)

(56) References Cited

U.S. PATENT DOCUMENTS

| | | | |
|---|---|---|---|
| 7,995,388 B1* | 8/2011 | Winter | G11C 11/5642 365/185.03 |
| 8,248,851 B1* | 8/2012 | Pio | G11C 11/5642 365/185.11 |
| 8,418,026 B2 | 4/2013 | D'Abreu et al. | |
| 8,441,853 B2 | 5/2013 | Li | |
| 8,508,995 B2 | 8/2013 | Weingarten et al. | |
| 8,665,643 B2 | 3/2014 | Kim et al. | |
| 2005/0162913 A1 | 7/2005 | Chen | |
| 2006/0221714 A1* | 10/2006 | Li | G11C 11/5642 365/185.2 |
| 2008/0050874 A1* | 2/2008 | Won | H01L 23/5223 438/250 |
| 2009/0073763 A1 | 3/2009 | Hosono | |
| 2010/0165741 A1 | 7/2010 | Han | |
| 2011/0026331 A1* | 2/2011 | Dong | G11C 16/0483 365/185.19 |
| 2011/0286276 A1* | 11/2011 | Lin | G11C 16/0483 365/185.18 |
| 2012/0063236 A1* | 3/2012 | Hung | G11C 11/5642 365/185.24 |
| 2012/0140560 A1 | 6/2012 | Yang | |
| 2012/0268994 A1* | 10/2012 | Nagashima | G06F 11/1048 365/185.11 |
| 2012/0300550 A1* | 11/2012 | Hemink | G11C 16/3427 365/185.17 |
| 2013/0063997 A1* | 3/2013 | Maislos | G11C 16/26 365/45 |
| 2013/0201760 A1* | 8/2013 | Dong | G11C 11/5642 365/185.17 |
| 2014/0003152 A1 | 1/2014 | Sharon | |

OTHER PUBLICATIONS

Kim, et al., "Investigation of self boosting disturbance induced by channel coupling in 3D stacked NAND flash memory," 2011 International Semiconductor Device Research Symposium (ISDRS), pp. 1 and 2; Dec. 7-9, 2011.

Yaakobi, Eitan, et al., "Characterization and Error-Correcting Codes for TLC Flash Memories," International Conference on Computing, Networking and Communications (ICNC), Jan. 30-Feb. 2, 2012, 6 pages.

"Technical Note: Error Correction Code (ECC) in Micron Single-Level Cell (SLC) NAND," Micron Technology, Inc., [http://www.micron.com/~/media/Documents/Products/Technical%20Note/NAND%20Flash/tn2963_ecc_in_slc_nand.pdf], Jun. 2006, 12 pages.

International Search Report & The Written Opinion of the International Searching Authority dated Jun. 2, 2015, International Application No. PCT/US2015/024273.

* cited by examiner

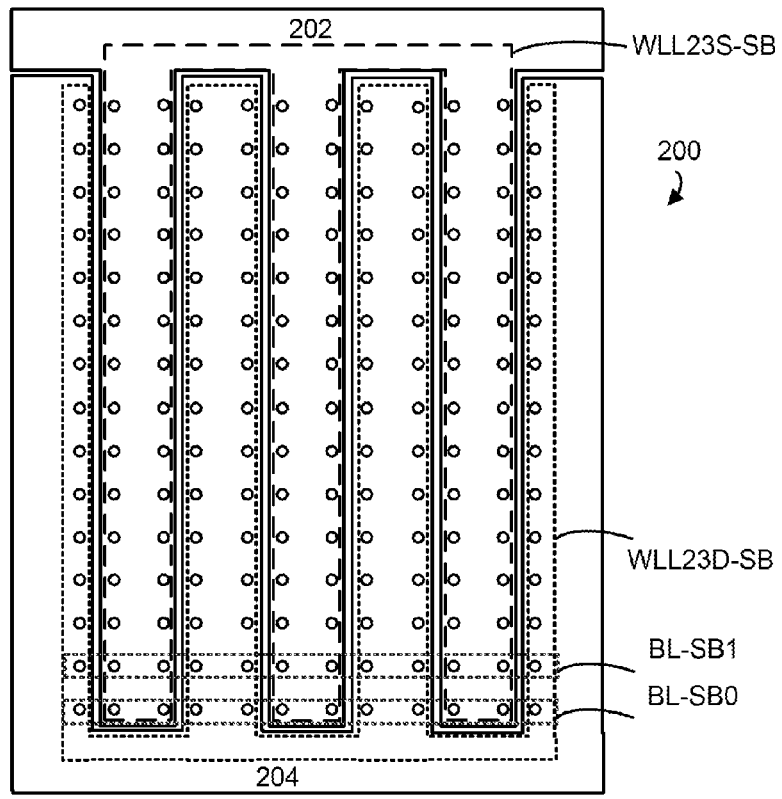
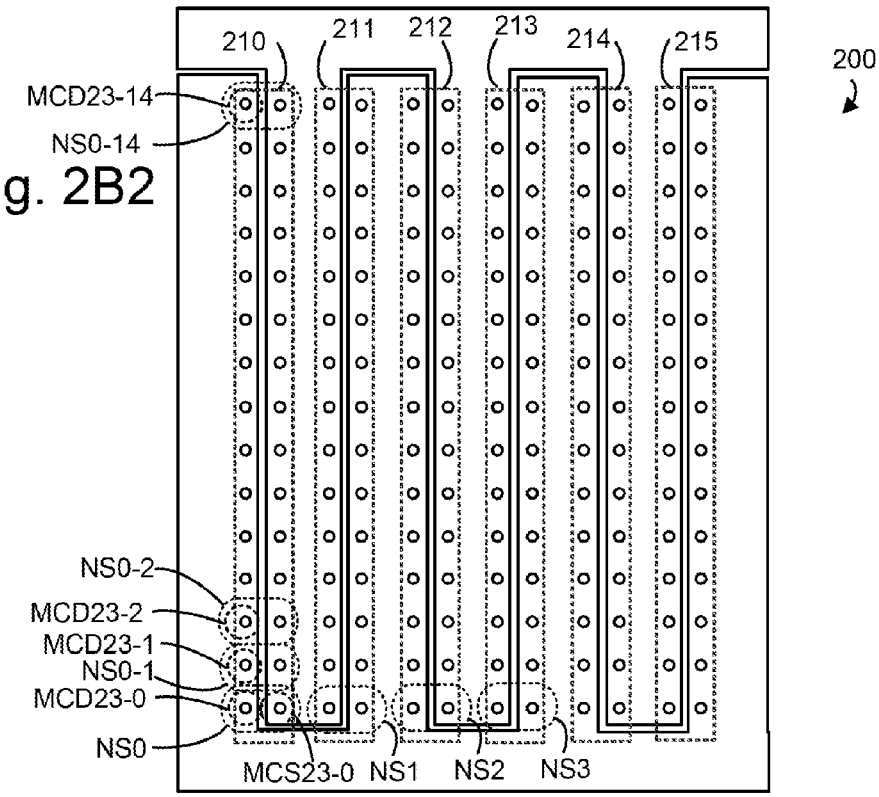

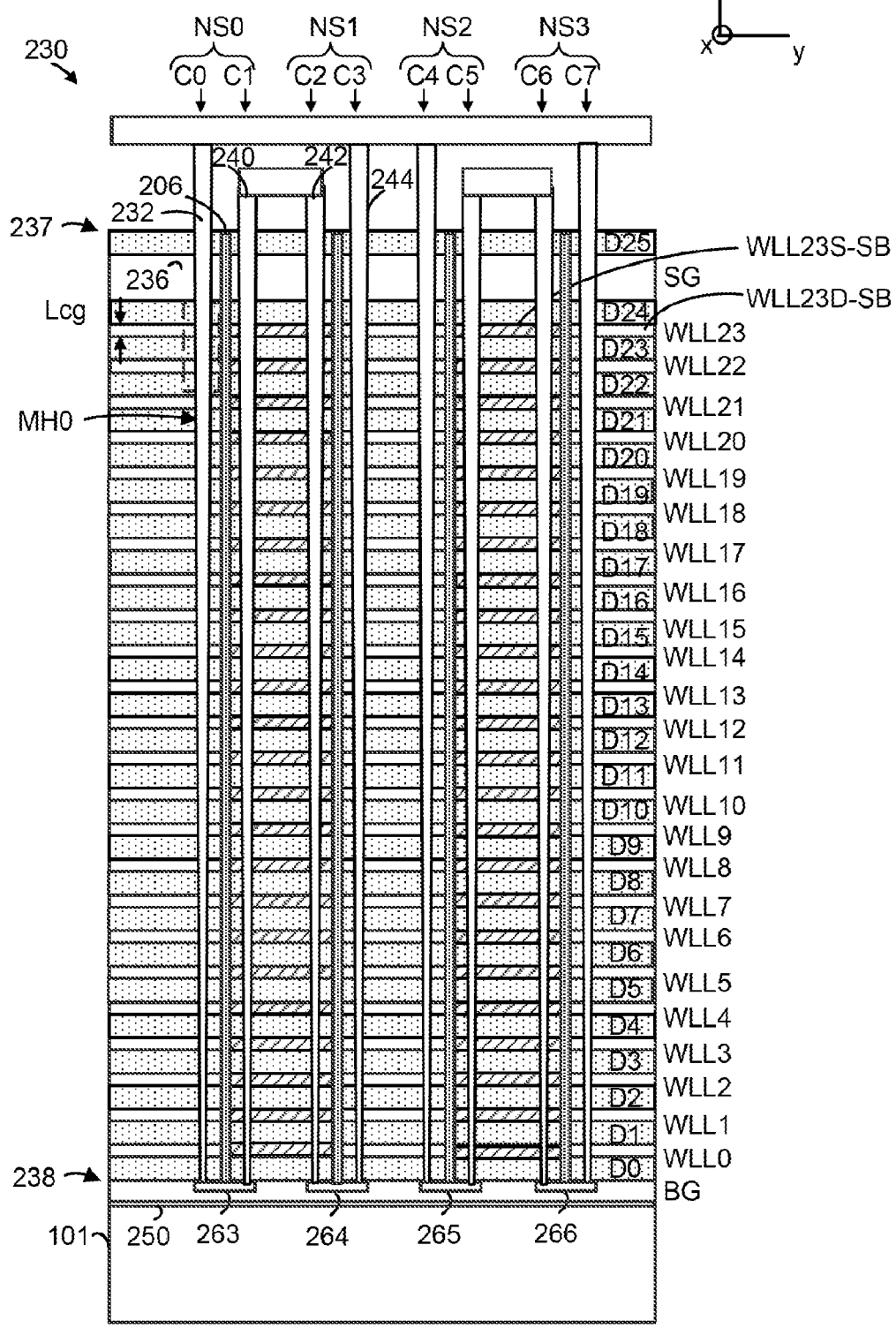

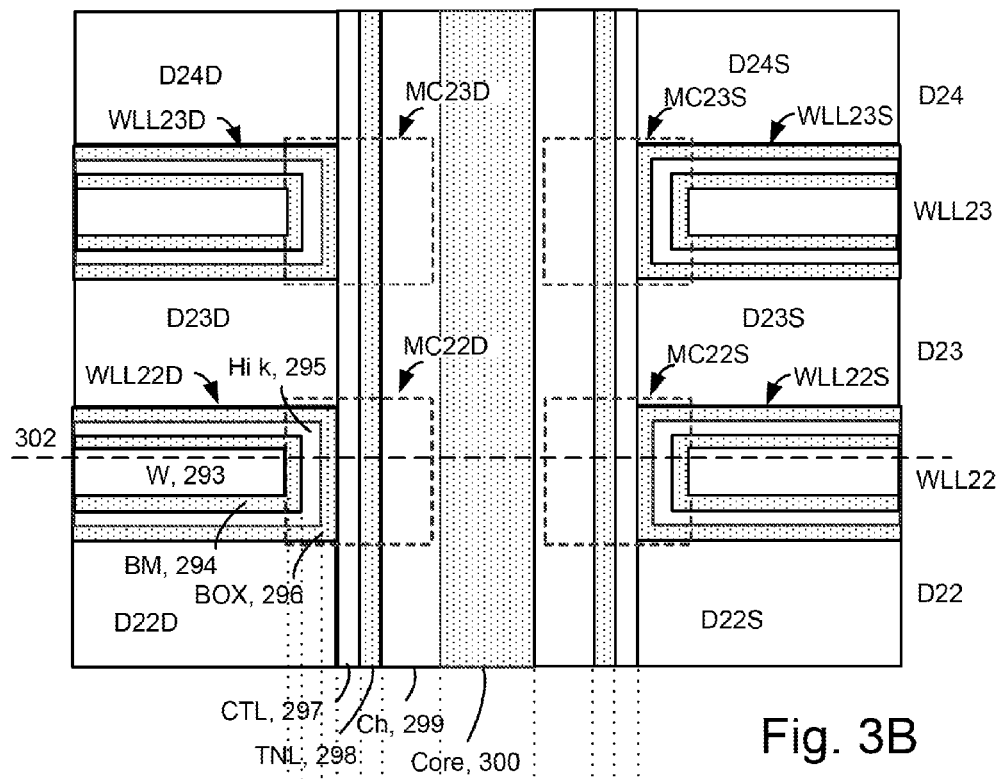
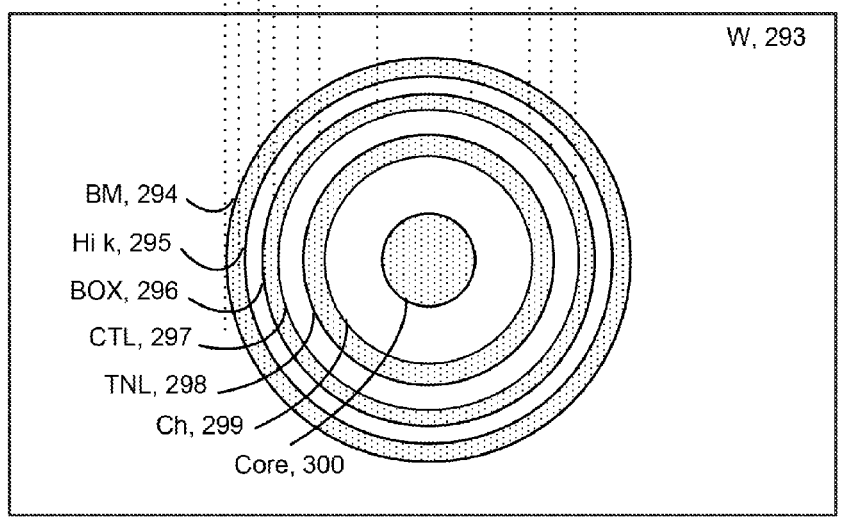

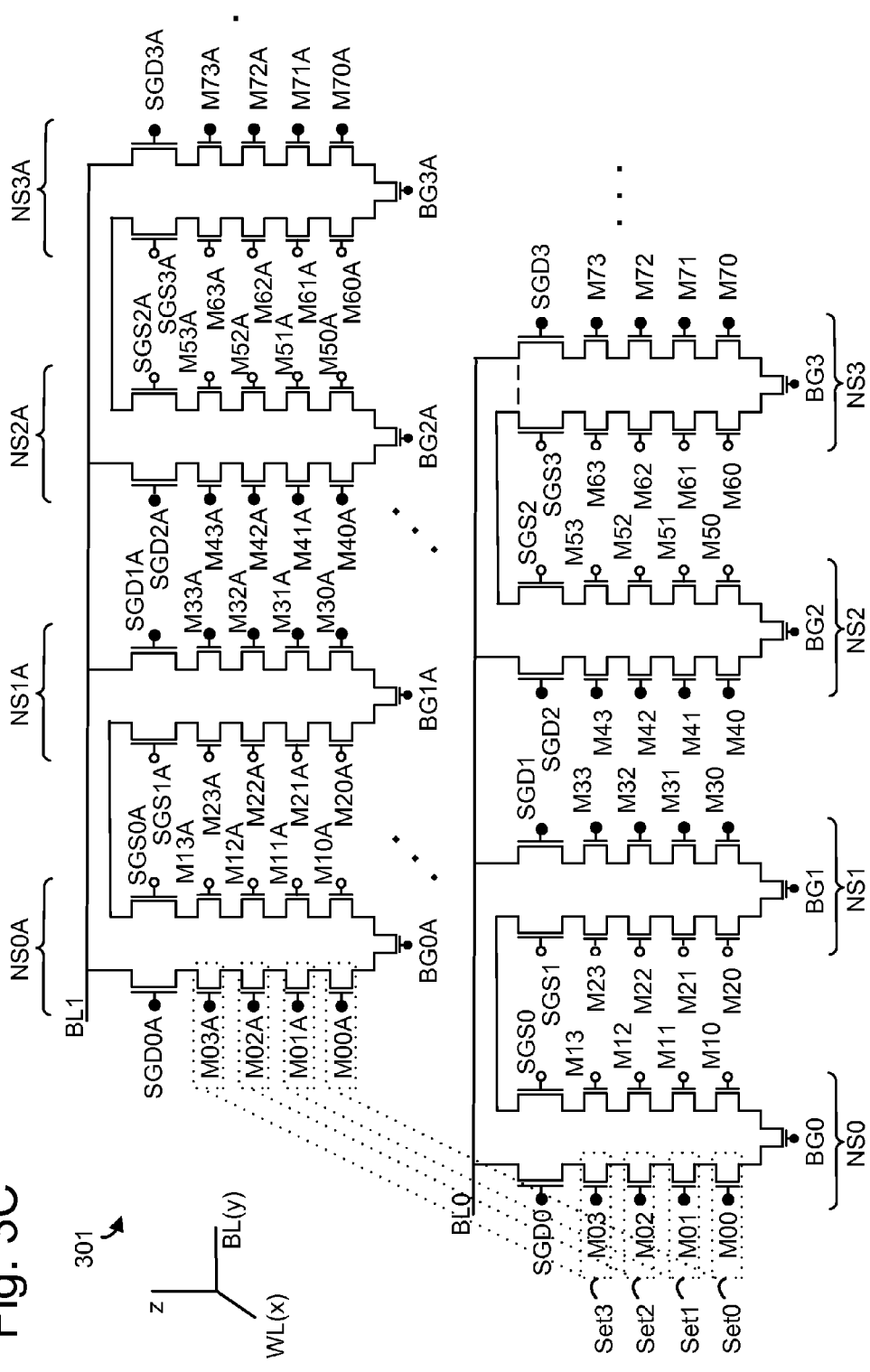

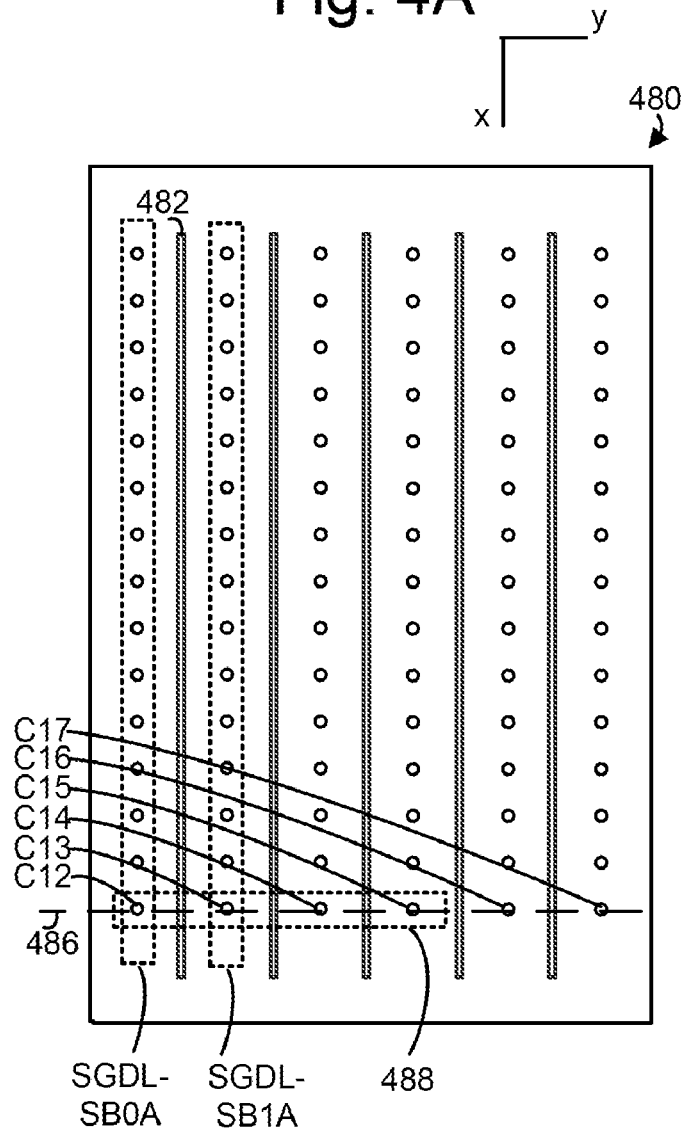

Fig. 4B1
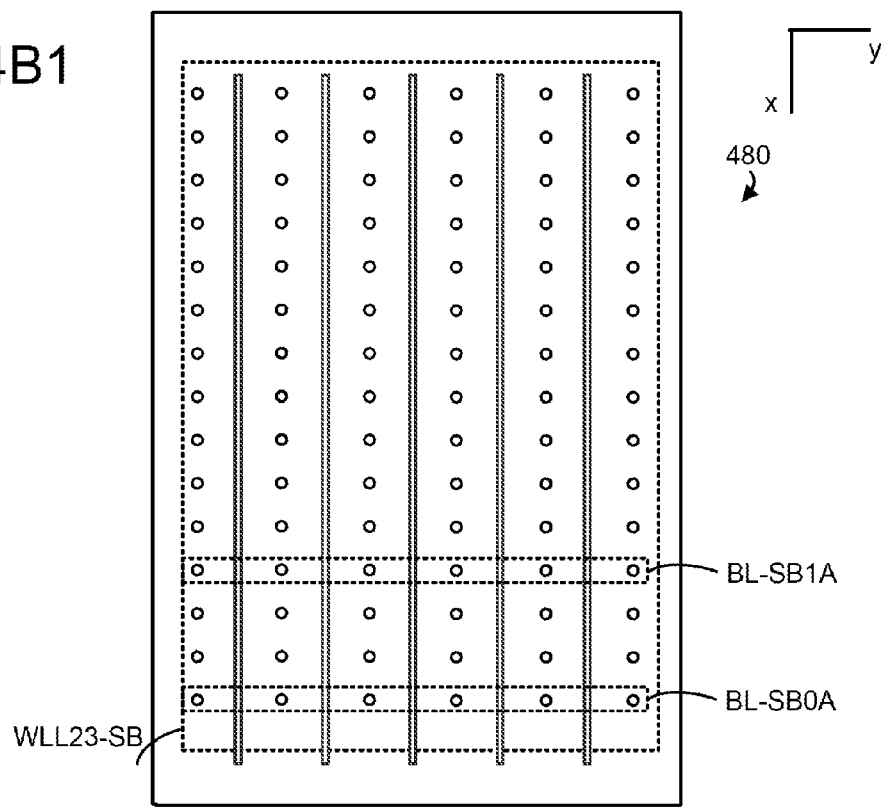
Fig. 4B2
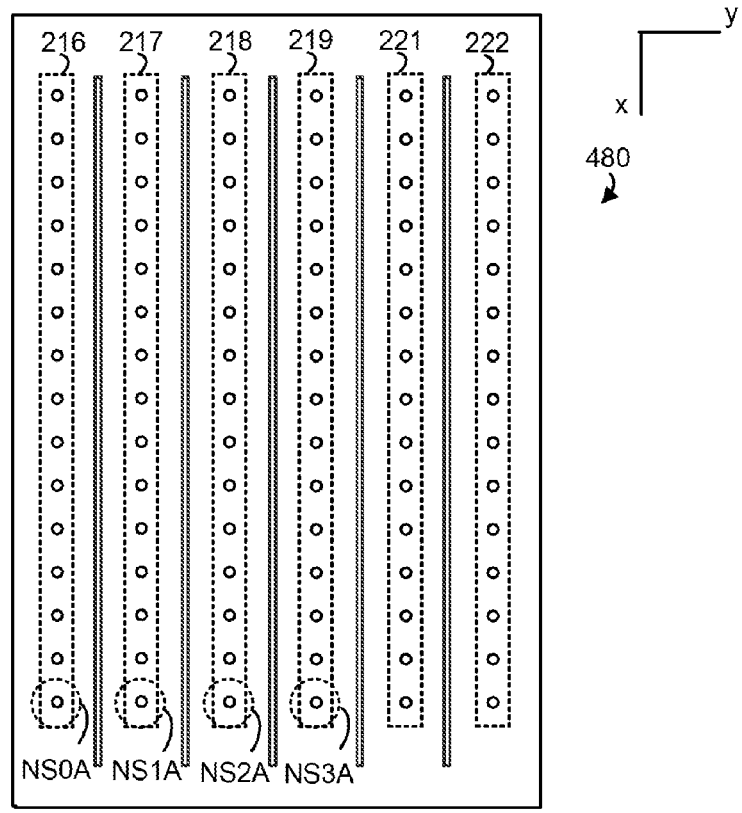

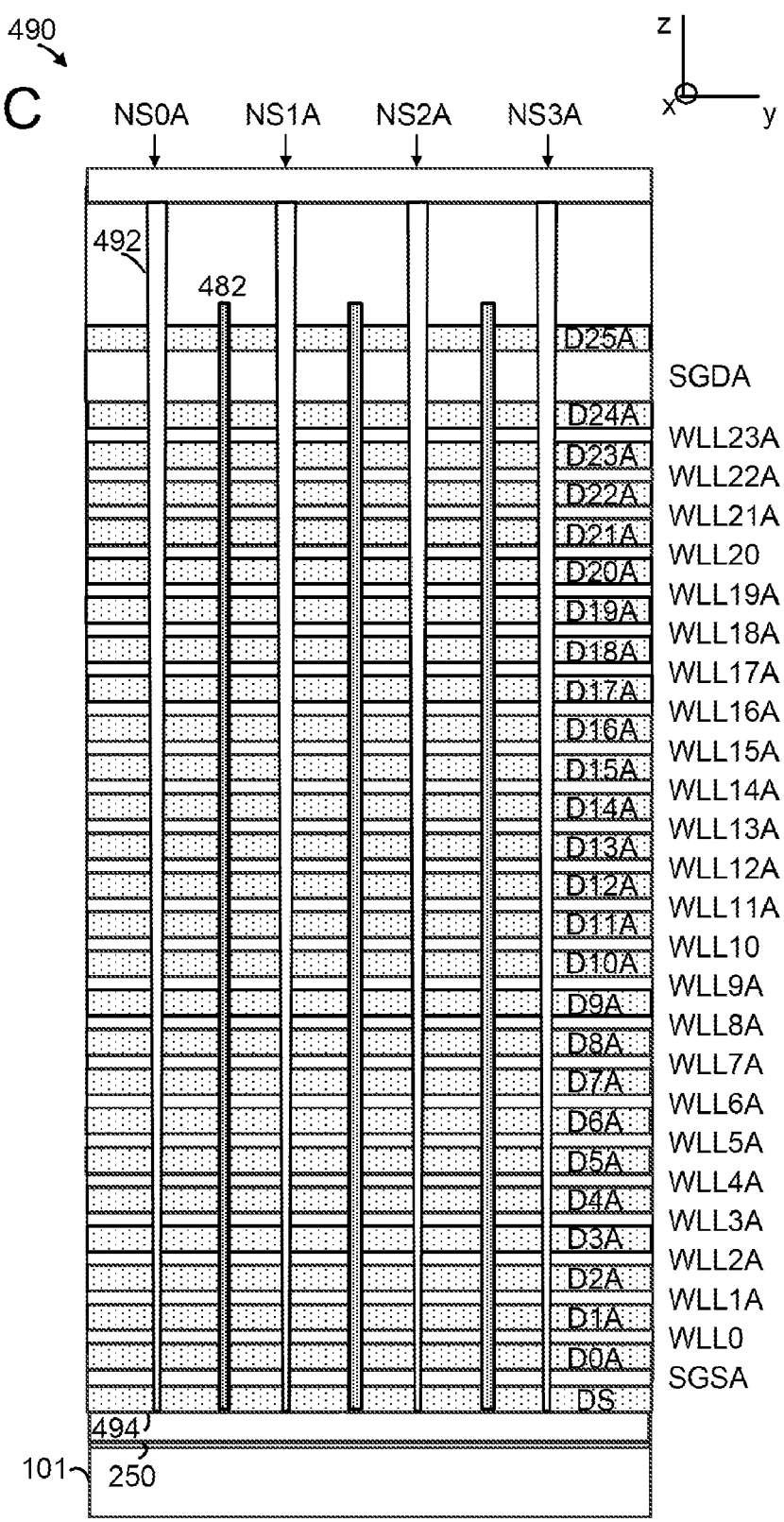

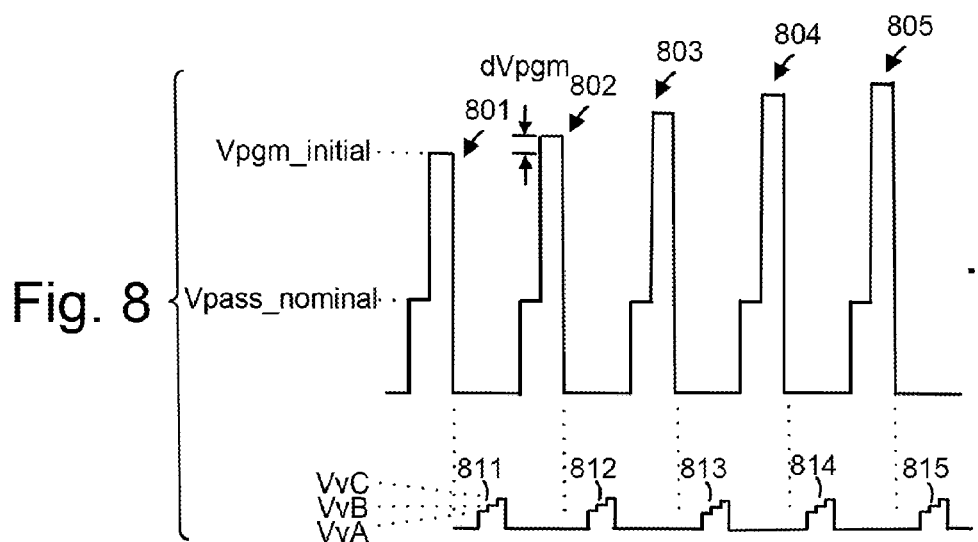

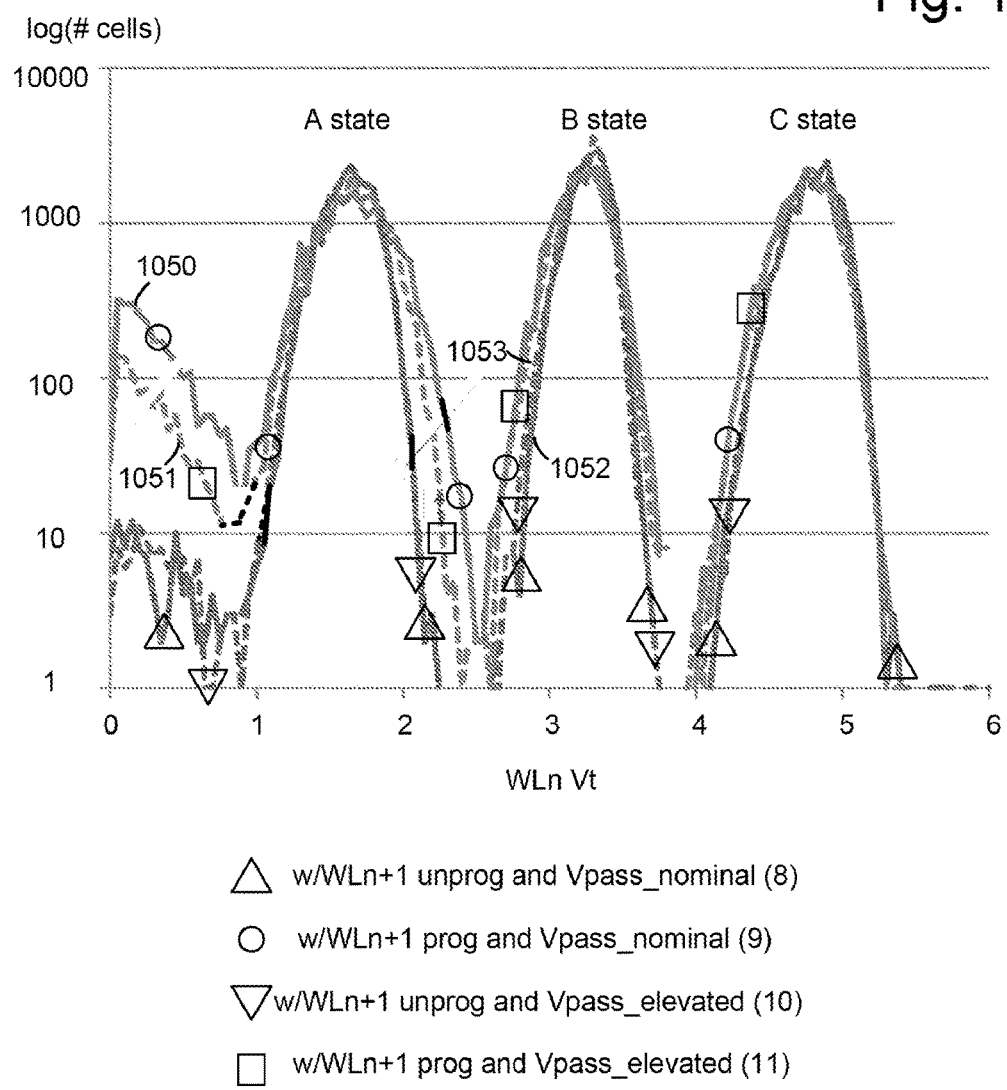

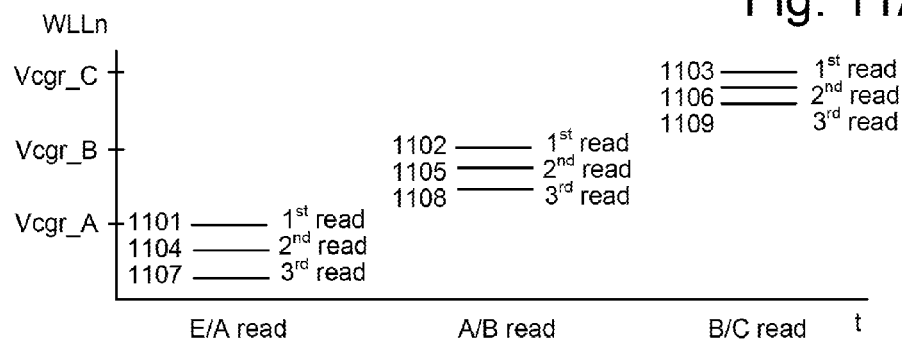
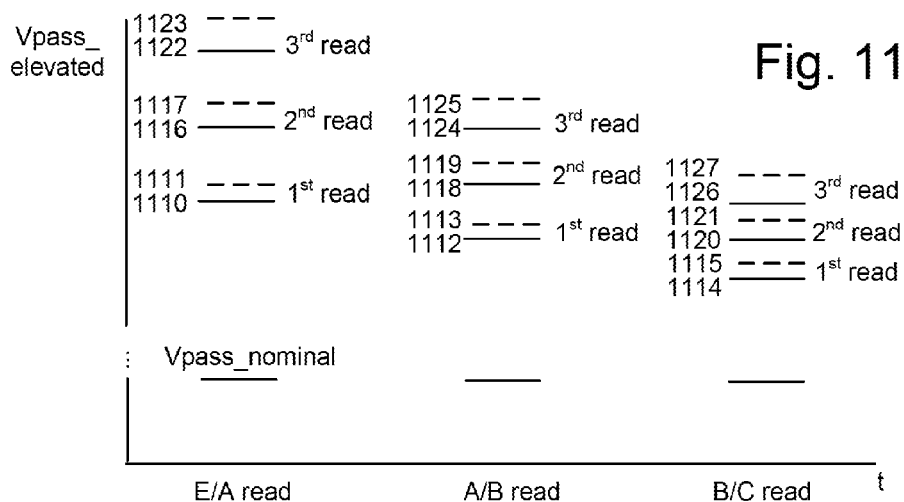
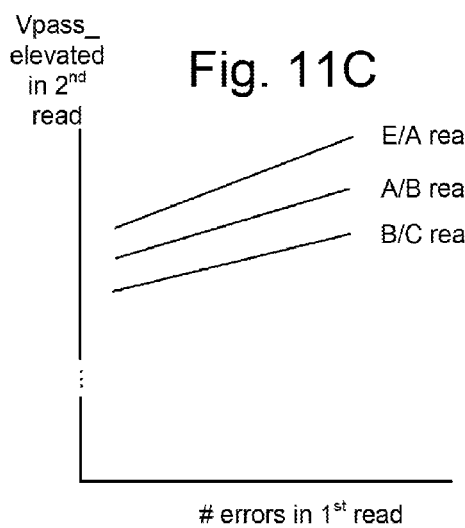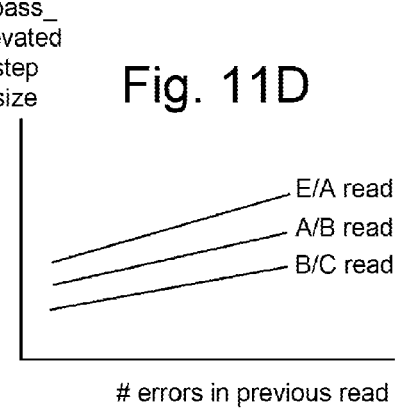

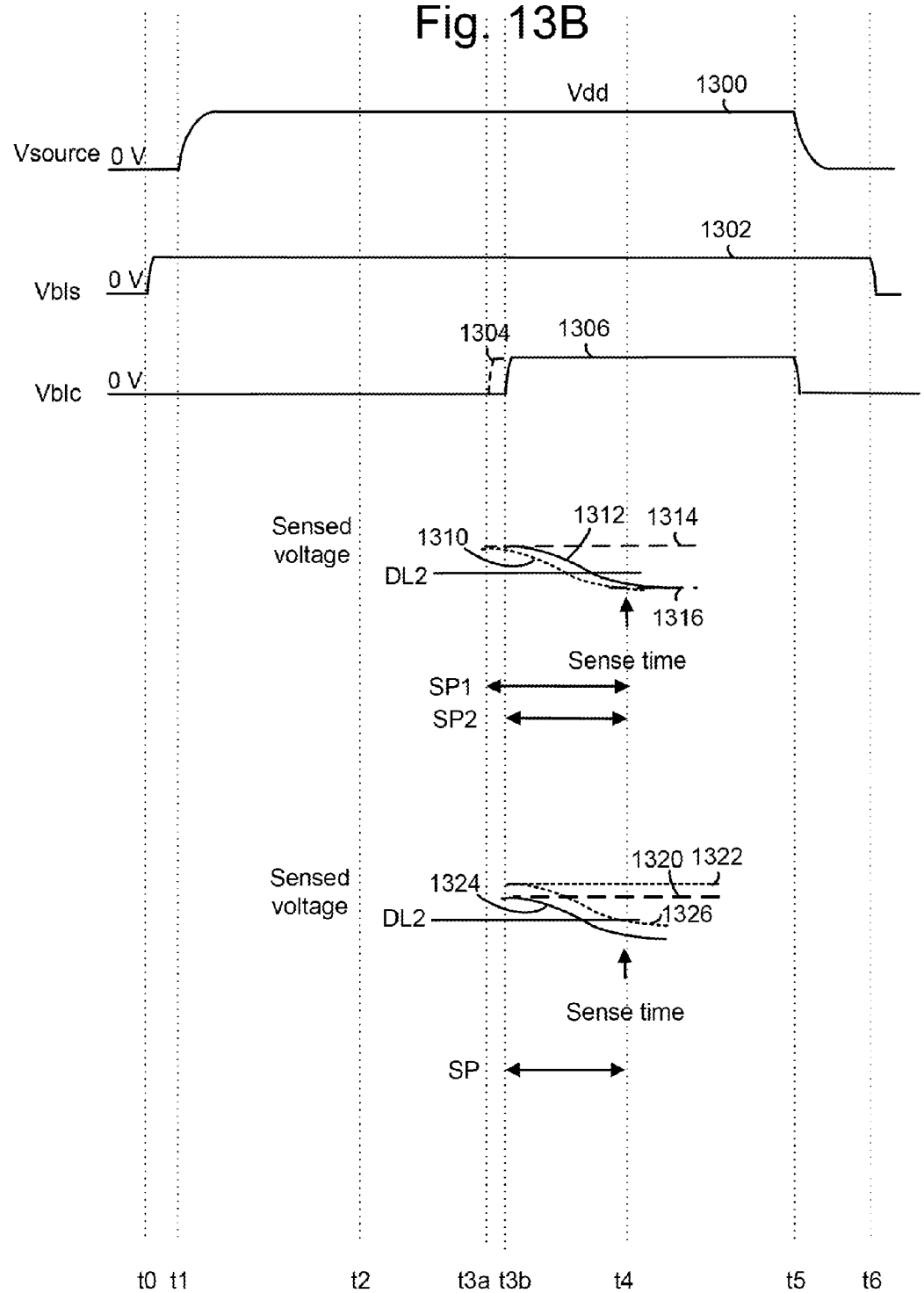

NEIGHBORING WORD LINE PROGRAM DISTURB COUNTERMEASURE FOR CHARGE-TRAPPING MEMORY

BACKGROUND

The present technology relates to techniques for reading memory cells in a 3D non-volatile memory device.

Recently, ultra high density storage devices have been proposed using a 3D stacked memory structure sometimes referred to as a Bit Cost Scalable (BiCS) architecture. For example, a 3D NAND stacked memory device can be formed from an array of alternating conductive and dielectric layers. A memory hole is drilled in the layers to define many memory layers simultaneously. A NAND string is then formed by filling the memory hole with materials including a charge trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers. However, various challenges are presented in operating such memory devices.

BRIEF DESCRIPTION OF THE DRAWINGS

Like-numbered elements refer to common components in the different figures.

FIG. 2B1 depicts the block 200 FIG. 2A, showing example word line subsets WL23D-SB and WL23S-SB and example bit line subsets BL-SB0 and BL-SB1.

FIG. 2B2 depicts the block 200 FIG. 2A, showing example sets of NAND strings 210-215.

FIG. 2C depicts an embodiment of a stack 230 showing a cross-sectional view of the portion 209 of the block 200 of FIG. 2A, along line 220.

FIG. 3A depicts a close-up view of the region 236 of the column C0 of FIG. 2C, showing example memory cells MC23D, MC22D, MC23S and MC22S.

FIG. 3B depicts a cross-sectional view along line 302 of FIG. 3A.

FIG. 3C depicts one embodiment of a circuit 301 in a 3D stacked non-volatile memory device.

FIG. 4A depicts a top view of a straight NAND string embodiment (block 480) of the block BLK0 of FIG. 1A, showing example SGD line subsets SGDL-SB0A and SGDL-SB1A.

FIG. 4B1 depicts the block BLK0 of FIG. 4A, showing an example WL line subset WL23-SB and example bit line subsets BL-SB0A and BL-SB1A.

FIG. 4B2 depicts the block BLK0 of FIG. 4A, showing example sets of NAND strings 216-219, 221 and 222.

FIG. 4C depicts a cross-sectional view of the portion 488 of the block 480 of FIG. 4A along line 486.

FIG. 8 depicts program and verify voltages in a programming operation, consistent with FIG. 5B.

FIG. 10E depicts a Vt distribution from test data of a first set of memory cells on WLLn where: (8) WLLn+1 is unprogrammed and Vpass_nominal is used on WLLn+1 when WLLn is read, (9) WLLn+1 is programmed and Vpass_nominal is used on WLLn+1 when WLLn is read, (10) WLLn+1 is unprogrammed and Vpass_elevated is used on WLLn+1 when WLLn is read, and (11) WLLn+1 is programmed and Vpass_elevated is used on WLLn+1 when WLLn is read.

FIG. 11A depicts a control gate voltage on WLLn as a function of time during a read operation for distinguishing four data states in a first set of memory cells on WLLn, consistent with FIG. 5A.

FIG. 11B depicts Vpass_elevated on WLLn+1 and Vpass_nominal on remaining unselected word line layers as a function of time during a read operation for a first set of memory cells on WLLn, time-aligned with FIG. 11A, and consistent with FIG. 5A.

FIG. 11C depicts Vpass_elevated on WLLn+1 during a second read operation (a first data recovery read operation) for a first set of memory cells on WLLn, as a function of a number of errors during a first (normal) read operation, and consistent with FIG. 5A.

FIG. 11D depicts a step size for Vpass_elevated during a data recovery read operation for a first set of memory cells on WLLn, as a function of a number of errors during a previous read operation, and consistent with FIG. 5A.

FIG. 13B depicts waveforms associated with FIG. 13A.

DETAILED DESCRIPTION

Figure 1A:
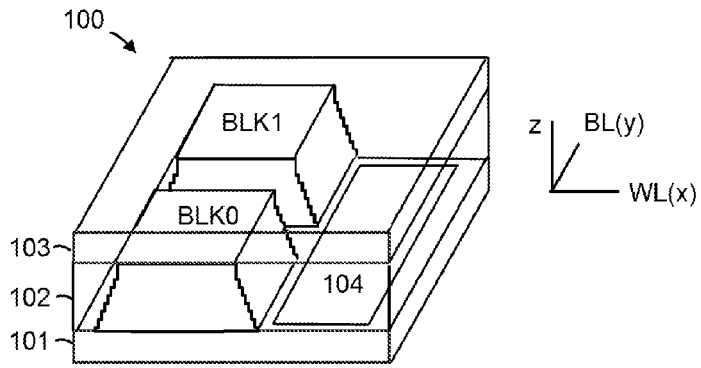
FIG. 1A is a perspective view of a 3D stacked non-volatile memory device.

Techniques are provided for reading memory cells which are subject to program disturb due to the trapping of charge in a charge trapping layer between memory cells.

One example implementation involves reading cells in a 3D stacked non-volatile memory device. In such a memory device, memory cells are formed along memory holes which extend through alternating conductive layers (word line layers) and dielectric layers in a stack. The memory cells are typically arranged in NAND strings. The memory holes comprise a charge trapping layer which holds charges after a cell is programmed.

However, as such memory devices are scaled down in size, the distance (e.g., a vertical distance) between adjacent cells on a common charge trapping layer becomes smaller. As the spacing is reduced, a special type of program disturb referred to as neighboring word line program disturb becomes significant. With this disturb, a victim memory cell on an nth word line layer (WLLn) is disturbed by the programming of an adjacent memory cell. For example, the adjacent memory cell may be directly above the victim memory cell, e.g., on WLLn+1 and on the same NAND string. This disturb is cause by the high programming voltage (Vpgm) used to program the memory cells on WLLn+1 to higher data states. For example, this can be the C state in a four state memory device which stores data in erased (E), A, B and C states. As another example, this can be the F and G states in an eight state memory device which stores data in erased (Er), A, B, C, D, E, F and G states. This programming results in a fringing field which injects electrons into a portion of the charge trapping layer which is between the adjacent memory cells. Moreover, electron injection can also be caused by the pass voltage which is applied to WLLn when WLLn+1 is programmed. The trapped charges act as a parasitic cell which impairs the ability to read back data from the cells on WLLn. Moreover, the cells on each word line layer can be disturbed in turn as each successive word line layer is programmed and parasitic cells are formed between each adjacent pair of cells along a common charge trapping layer.

Techniques provided herein address the above-mentioned issues. In one approach, the data stored in the cells can be coded using an error correction code (ECC). When the data is read, the ECC code is used to determine if there are uncorrectable errors. If there are one or more uncorrectable errors, a data recovery read operation is used to attempt to recover the data. In this approach, the data on WLLn+1 may first be copied to another location since it may be disturbed by the data recovery read operation. The data recovery read operation attempts to read the cells on WLLn while applying an elevated pass voltage on WLLn+1. The elevated pass voltage causes a decrease and narrowing of the Vt distribution on WLLn which facilitates reading. The data recovery read operation compensates for the lower Vt distribution by lowering the control gate voltage, raising the source voltage or adjusting a sensing period, demarcation level or pre-charge voltage level in sensing circuitry. The elevated pass voltage can be stepped up in repeated read attempts until there are no uncorrectable errors or a maximum allowable pass voltage is reached.

Advantages of the above-mentioned techniques include providing the ability to read data which has been subject to program disturb.

The following discussion provides details of the construction of a memory device and of related programming and sensing techniques which address the above-mentioned issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
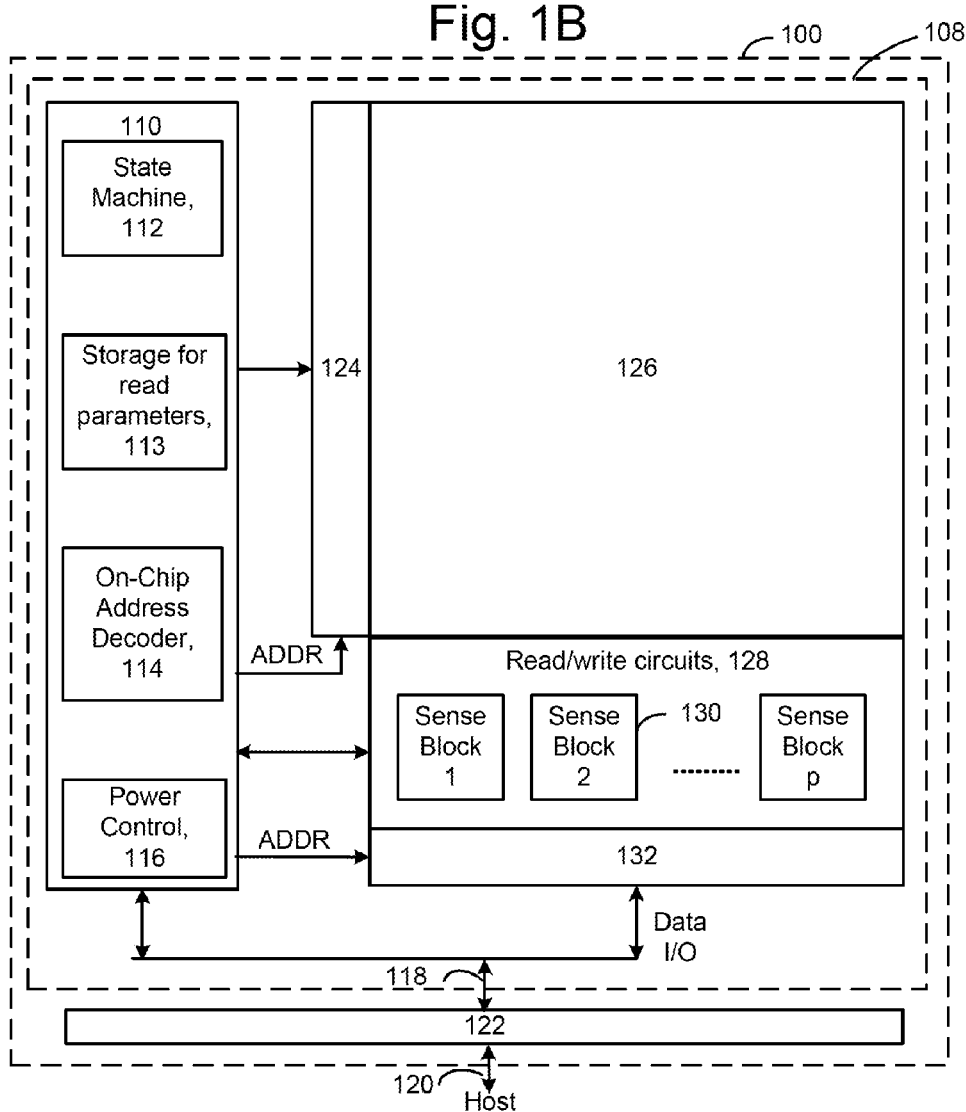
FIG. 1B is a functional block diagram of the 3D stacked non-volatile memory device 100 of FIG. 1A.

FIG. 1B is a functional block diagram of the 3D stacked non-volatile memory device 100 of FIG. 1A. The memory device 100 may include one or more memory die 108. The memory die 108 includes a 3D (three-dimensional) stacked memory array or structure 126 of memory cells, e.g., including the blocks BLK0 and BLK1, control circuitry 110, and read/write circuits 128. The memory array 126 is addressable by word lines via a row decoder 124 and by bit lines via a column decoder 132. The read/write circuits 128 include multiple sense blocks 130 (sensing circuitry) and allow a page of memory cells to be read or programmed in parallel. Typically a controller 122 is included in the same memory device 100 (e.g., a removable storage card) as the one or more memory die 108. Commands and data are transferred between the host and controller 122 via lines 120 and between the controller and the one or more memory die 108 via lines 118.

The control circuitry 110 cooperates with the read/write circuits 128 to perform memory operations on the memory array 126, and includes a state machine 112, an on-chip address decoder 114, and a power control module 116. The state machine 112 provides chip-level control of memory operations. The on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for WLLs, drain- and source-side select gate drivers (referring, e.g., to drain- and source-sides or ends of a string of memory cells such as a NAND string, for instance) and source lines. The sense blocks 130 can include bit line drivers, in one approach.

A storage location 113 may be provided for read parameters. As described further below, this can include pass voltages for unselected word lines, control gate read voltages, Vsource and parameters in a sensing circuitry such as sensing period, demarcation level or pre-charge level. The read parameters can also be used to implement the plots of FIG. 11B-11K. The read parameters can include data which is predetermined and data which is determined at the time of a read operation. The storage locations may use ROM fuses or data registers, for example, for the predetermined data.

In some implementations, some of the components can be combined. In various designs, one or more of the components (alone or in combination), other than memory array 126, can be thought of as at least one control circuit. For example, a control circuit may include any one of, or a combination of, control circuitry 110, state machine 112, decoders 114/132, power control module 116, sense blocks 130, read/write circuits 128, and controller 122, and so forth.

In another approach, a non-volatile memory system uses dual row/column decoders and read/write circuits. Access to the memory array 126 by the various peripheral circuits is implemented in a symmetric fashion, on opposite sides of the array, so that the densities of access lines and circuitry on each side are reduced by half. Thus, the row decoder is split into two row decoders and the column decoder into two column decoders. Similarly, the read/write circuits are split into read/write circuits connecting to bit lines from the bottom and read/write circuits connecting to bit lines from the top of the memory array 126. In this way, the density of the read/write modules is reduced by one half.

Other types of non-volatile memory in addition to NAND flash memory can also be used.

Figure 2A:
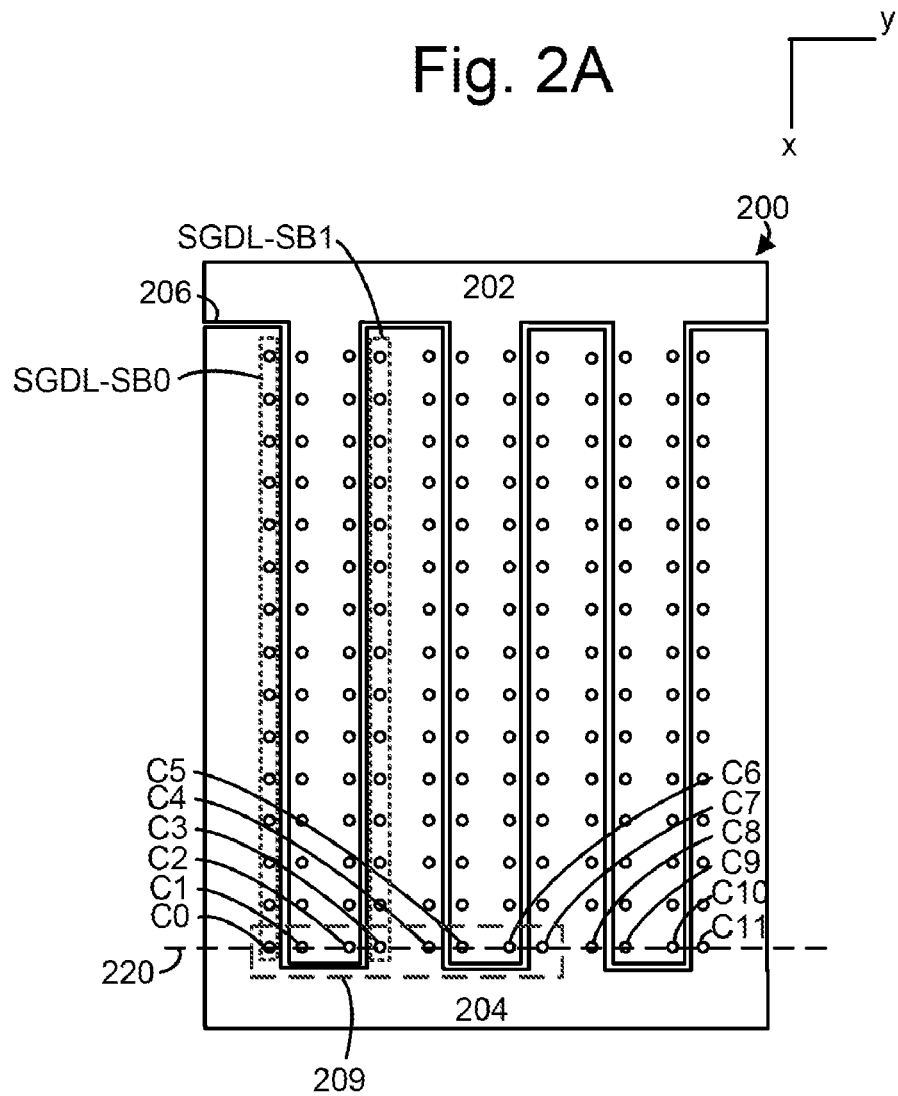
FIG. 2A depicts a top view of a U-shaped NAND embodiment of a block 200, showing example SGD line subsets SGDL-SB0 and SGDL-SB1, as an example implementation of BLK0 in FIG. 1A.

FIG. 2A depicts a top view of a U-shaped NAND embodiment of a block 200, showing example SGD line subsets SGDL-SB0 and SGDL-SB1, as an example implementation of BLK0 in FIG. 1A. The view is of a representative layer among the multiple WLLs in a stack. Referring also to FIG. 2C, the stack includes alternating dielectric and conductive layers. The dielectric layers include D0 to D25 and may be made of SiO2, for instance. The conductive layers include BG, which is a back gate layer, WLL0 to WLL23, which are conductive paths to control gates of the memory cells at the layer, and SG, which is a select gate layer, e.g., a conductive path to control gates of select gate transistors of NAND strings. FIG. 2A may represent any one of WLL0 to WLL23, for instance, in an example with twenty-four WLLs. The conductive layers may include doped polysilicon, metal silicide or a metal, for instance. An example voltage of 5-10 V may be applied to the back gate to maintain a conductive state which connects the drain- and source-side columns.

For each block, the WLL is divided into two portions 202 and 204. Each block includes a slit pattern. A slit is a void which extends vertically in the stack, typically from an etch stop layer at the bottom to at least a top layer of the stack. The slit can be filled with insulation to insulate words line layer portions from one another. A slit 206 is a single continuous slit which extends in a zig-zag pattern in the block so that the block is divided into two portions, 202 and 204, which are insulated from one another. This approach can provide greater flexibility in controlling the memory cells since the WLL portions can be driven independently.

Each block includes rows of columnar, e.g., vertical, memory holes or pillars, represented by circles. Each row represents a vertical group of columns in the figure. The memory holes extend vertically in the stack and include memory cells such as in a vertical NAND string. Example columns of memory cells along a line 220 include C0 to C11. The figure represents a simplification, as many more rows of memory holes will typically be used, extending to the right and left in the figure. Also, the figures are not necessarily to scale. The columns of memory cells can be arranged in subsets such as sub-blocks.

Subsets of memory cells can be of different types, such as WL subsets, SGD line subsets and BL subsets.

A portion 209 of the block is depicted in further detail in connection with FIG. 2C.

FIG. 2B1 depicts the block 200 FIG. 2A, showing example word line subsets WL23D-SB and WL23S-SB and example bit line subsets BL-SB0 and BL-SB1. This example assumes that the WLL23 layer is depicted. WLL23S-SB is a WLL portion in communication with one memory cell in the source-side of each U-shaped NAND string, and WLL23D-SB is a WLL portion in communication with one memory cell in the drain-side of each U-shaped NAND string.

When U-shaped NAND strings are used, each SGD line subset can include two adjacent rows of columns of memory cells. In a subset, the adjacent rows are separated by the slit. The columns of memory cells on one side of the slit are drain-side columns (e.g., C0, C3, C4 and C7 in FIG. 2C) of NAND strings, and the columns of memory cells on the other side of the slit are source-side columns (e.g., C1, C2, C5 and C6 in FIG. 2C) of the NAND strings. Note that the pattern of two source-side columns between two drain-side columns repeats in the y-direction.

Word line drivers can independently provide signals such as voltage waveforms to the WLL portions 202 and 204.

The drawings are not to scale and do not show all memory columns. For example, a more realistic block might have twelve memory columns in the y direction as shown, but a very large number such as 32 k memory columns in the x direction, for a total of 384 k memory columns in a block. With U-shaped NAND strings, 192 k NAND strings are provided in this example. With straight NAND strings, 384 k NAND strings are provided in this example. Assuming there are twenty-four memory cells per column, there are 384 k×24=9,216 k memory cells in the set. Sets of NAND strings 210-215 are also depicted.

FIG. 2B2 depicts the block 200 FIG. 2A, showing example sets of NAND strings 210-215. The set of NAND strings 210 includes an example NAND string NS0, such as depicted in FIG. 2B5 and example memory cells MCD23-0, MCD23-1, MCD23-2, . . . , MCD23-14, as depicted in FIG. 2B6. In this notation, "MC" denotes a memory cell, "D" denotes a drain side of the NAND strings, and the number (0, 1, 2, . . . , 14) denotes a number of the NAND string based on its position in the stack. NAND strings NS0, NS0-1, NS0-2, . . . , NS0-14 are also depicted.

FIG. 2C depicts an embodiment of a stack 230 showing a cross-sectional view of the portion 209 of the block 200 of FIG. 2A, along line 220. In one approach, the WLLs have a uniform thickness and the memory holes have another uniform thickness. Lcg represents a control gate length for the memory cells, which is the same as the thickness or height of each WLL. Columns of memory cells C0 to C7 are depicted in the multi-layer stack. The stack 230 includes the substrate 101, an insulating film 250 on the substrate, and a back gate layer BG, which is a conductive layer, on the insulating film. A trench is provided in portions of the back gate below pairs of columns of memory cells of a U-shaped NAND string. Layers of materials which are provided in the columns to form the memory cells are also provided in the trenches, and the remaining space in the trenches is filled with a semiconductor material to provide connecting portions 263 to 266 which connect the columns. The back gate thus connects the two columns of each U-shaped NAND string. For example, NS0 (NS=NAND string) includes columns C0 and C1 and connecting portion 263, and has a drain end 232 and a source end 240. NS1 includes columns C2 and C3 and connecting portion 264, and has a drain end 244 and a source end 242. NS2 includes columns C4 and C5 and connecting portion 265. NS3 includes columns C6 and C7 and connecting portion 266.

MH0, corresponding to C0, is depicted for reference. The memory hole is shown as becoming progressively and gradually narrower from the top 237 to the bottom 238 of the stack. The memory holes are columnar and extend at least from a top word line layer (WLL23) of the plurality of WLLs to a bottom word line layer (WLL0) of the plurality of WLLs.

The source line SL0 is connected to the source ends 240 and 242 of two adjacent memory strings NS0 and NS1. SL0 is also connected to other sets of memory strings which are behind NS0 and NS1 in the x direction. Additional U-shaped NAND strings in the stack 230 (e.g., NS0-1, NS0-2, . . . , NS0-14 from FIG. 2B6) extend behind the U-shaped NAND strings depicted in the cross-section, e.g., along the x-axis, in a SGD line direction. The U-shaped NAND strings NS0 to NS3 are each in a different SGD line subset, but are in a common BL subset.

The slit 206 from FIG. 2A is also depicted as an example. In the cross-section, multiple slit portions are seen, where each slit portion is between the drain- and source-side columns of a U-shaped NAND string. A portion of the bit line BL0 is also depicted.

A region 236 of the stack is shown in greater detail in FIG. 3A.

Word line layers WLL0-WLL23 and dielectric layers D0-D24 extend alternatingly in the stack. The SG layer is between D24 and D2. Each WLL has a drain-side portion and a source-side portion. For example, WL23S-SB is a source-side sub-block of WLL23, and WL23D-SB is a drain-side sub-block of WLL23, consistent with FIG. 2B1. In each WLL, the diagonal line patterned region represents the source-side sub-block, and the unpatterned region represents the drain-side sub-block.

FIG. 3A depicts a close-up view of the region 236 of the column C0 of FIG. 2C, showing example memory cells MC23D, MC22D, MC23S and MC22S. The region also shows portions D24D and D24S of the dielectric layer D24, portions D23D and D23S of the dielectric layer D23, and portions D22D and D22S of the dielectric layer D22. The region also shows portions WLL24D and WLL24S of the conductive layer WLL24, portions WLL23D and WLL23S of the conductive layer WLL23, and portions WLL22D and WLL22S of the conductive layer WLL22.

A number of layers can be deposited along the sidewalls of the column and within each word line layer. These layers can include oxide-nitride-oxide (O—N—O) and polysilicon layers which are deposited, e.g., using atomic layer deposition. For example, the column includes a charge trapping layer or film (CTL) 297 such as SiN or other nitride, a tunnel oxide (TNL) 298, a polysilicon body or channel (CH) 299, and a core filler dielectric 300. The word line layer includes a block oxide (BOX) 296, a block high-k material 295, a barrier metal 294, and a conductive metal such as W 293. In another approach, all of these layers except the W are provided in the column. Additional memory cells are similarly formed throughout the columns.

When a memory cell is programmed, electrons are stored in a portion of the CTL which is associated with the memory cell. These electrons are drawn into the CTL from the channel, and through the TNL. The Vth of a memory cell is increased in proportion to the amount of stored charge. See also FIG. 10B.

Each respective memory cell of the first set of memory cells is adjacent to, and is arranged along a common charge trapping layer with, a respective memory cell of the second set of memory cells. For example, MC23D is adjacent to, and is arranged along a common charge trapping layer 297 with, MC22D. Also, MC23S is adjacent to, and is arranged along a common charge trapping layer 297 with, MC22S.

FIG. 3B depicts a cross-sectional view along line 302 of FIG. 3A. Each layer is ring-shaped in one possible approach, except the core filler, which is a cylinder.

FIG. 3C depicts one embodiment of a circuit 301 in a 3D stacked non-volatile memory device. As a simplification, four memory cells are provided per column.

NAND strings NS0, NS1, NS2 and NS3 are in communication with a bit line BL0, and NAND strings NS0A, NS1A, NS2A and NS3A are in communication with a bit line BL1. In this example, each NAND string has a drain-side column with four memory cells and a SGD transistor, and a source-side column with four memory cells and a SGS transistor. The filled in circles indicate control gates of the select transistor and the memory cells on the drain side of a NAND string. The open circles indicate control gates of the select transistor and the memory cells on the source side of a NAND string.

For example, NS0 has a drain side column C0D comprising memory cells M00, M01, M02 and M03 and an SGD transistor SGD0, and a source side column C0S comprising memory cells M10, M11, M12 and M13 and an SGS transistor SGS0. NS1 has a drain side comprising memory cells M30, M31, M32 and M33 and an SGD transistor SGD1, and a source side comprising memory cells M20, M21, M22 and M23 and an SGS transistor SGS1. NS2 has a drain side comprising memory cells M40, M41, M42 and M43 and an SGD transistor SGD2, and a source side comprising memory cells M50, M51, M52 and M53 and an SGS transistor SGS2. NS3 has a drain side comprising memory cells M70, M71, M72 and M73 and an SGD transistor SGD3, and a source side comprising memory cells M60, M61, M62 and M63 and an SGS transistor SGS3.

Similarly, NS0A has a drain side comprising memory cells M00A, M01A, M02A and M03A and an SGD transistor SGD0A, and a source side comprising memory cells M10A, M11A, M12A and M13A and an SGS transistor SGS0A. NS1A has a drain side comprising memory cells M30A, M31A, M32A and M33A and an SGD transistor SGD1A, and a source side comprising memory cells M20A, M21A, M22A and M23A and an SGS transistor SGS1A. NS2A has a drain side comprising memory cells M40A, M41A, M42A and M43A and an SGD transistor SGD2A, and a source side comprising memory cells M50A, M51A, M52A and M53A and an SGS transistor SGS2A. NS3A has a drain side comprising memory cells M70A, M71A, M72A and M73A and an SGD transistor SGD3A, and a source side comprising memory cells M60A, M61A, M62A and M63A and an SGS transistor SGS3A.

Each NAND string has a back gate (BG0 for NS0, BG1 for NS1, BG2 for NS2, BG3 for NS3, BG0A for NS0A, BG1A for NS1A, BG2A for NS2A, BG3A for NS3A). The control gates of all of the back gates in the circuit may be connected to one another.

In one approach, the source side of each SGS transistor is connected to a common source line of the circuit.

A sets of memory cells includes cells that can be programmed or read together. For example, a set of memory cells can include cells connected to a common word line layer (WLL) portion and to a common SGD line. For example, Set0 includes cells M00-M00A, Set1 includes cells M01-M01A, Set2 includes cells M02-M02A, and Set3 includes cells M03-M03A.

At each level of the circuit, the control gates of the drain-side memory cells are connected to one another by a common WLL. For example, at the top WLL, M03, M03A, M33, M33A, M43, M43A, M73 and M73A have control gates connected by a word line layer. Similarly, the control gates of the source-side memory cells are connected to one another by a common WLL. For example, at the top WLL, M13, M13A, M23, M23A, M53, M53A, M63 and M63A have control gates connected by a word line layer.

Additionally, control gates of the SGD transistors are connected to one another. For example, control gates of SGD0, . . . , SGD0A are connected, control gates of SGD1, . . . , SGD1A are connected, control gates of SGD2, . . . , SGD2A are connected, and control gates of SGD3, . . . , SGD3A are connected.

The control gates of the SGS transistors are connected to one another in the x-direction. For example, control gates of SGS0, . . . , SGS0A are connected, control gates of SGS1, . . . , SGS1A are connected, control gates of SGS2, . . . , SGS2A are connected, and control gates of SGS3, . . . , SGS3A are connected.

FIG. 4A depicts a top view of a straight NAND string embodiment (block 480) of the block BLK0 of FIG. 1A, showing example SGD line subsets SGDL-SB0A and SGDL-SB1A. In this configuration, a NAND string has only one column, and the source-side select gate is on the bottom of the column instead of on the top, as in a U-shaped NAND string. Moreover, a given level of a block has one WLL which is connected to each of the memory cells of the layer.

For example, FIG. 4B1 depicts the block BLK0 of FIG. 4A, showing an example WL line subset WL23-SB and example bit line subsets BL-SB0A and BL-SB1A. A number of slits, such as example slit 482, can also be used. These insulation-filled slits are used in the fabrication process to provide structural support for the stack when undoped polysilicon layers are removed by a wet etch and a dielectric is deposited to form the alternating dielectric layers. A dashed line 486 extends through columns C12 to C17. A cross-sectional view along line 486 of portion 488 is shown in FIG. 4C.

FIG. 4B2 depicts the block BLK0 of FIG. 4A, showing example sets of NAND strings 216-219, 221 and 222. Example NAND strings NS0A-NS3A in the portion 488 are also depicted.

FIG. 4C depicts a cross-sectional view of the portion 488 of the block 480 of FIG. 4A along line 486. Columns of memory cells corresponding to NAND strings NS0A-NS3A in FIG. 4B2 are depicted in the multi-layer stack. In the portion, a stack 490 which includes a substrate 101, an insulating film 250 on the substrate, and a portion of a source line SL0A. Recall that the additional straight NAND strings in a SGD line subset extend in front of and in back of the NAND strings depicted in the cross-section, e.g., along the x-axis. NS0A has a source end 494 and a drain end 492. The slit 482 from FIG. 4A is also depicted with other slits. A portion of the bit line BL0A is also depicted. Dashed lines depict memory cells and select gate transistors. The techniques described herein can be used with a U-shaped or straight NAND. Word line layers WLL0-WLL23A are arranged alternatingly with dielectric layers D0A-D24A in the stack. An SGD layer, SGDA, an SGS layer, SGSA, and an additional dielectric layer DS are also depicted. SGDA is between D24A and D25A.

Figure 5A:
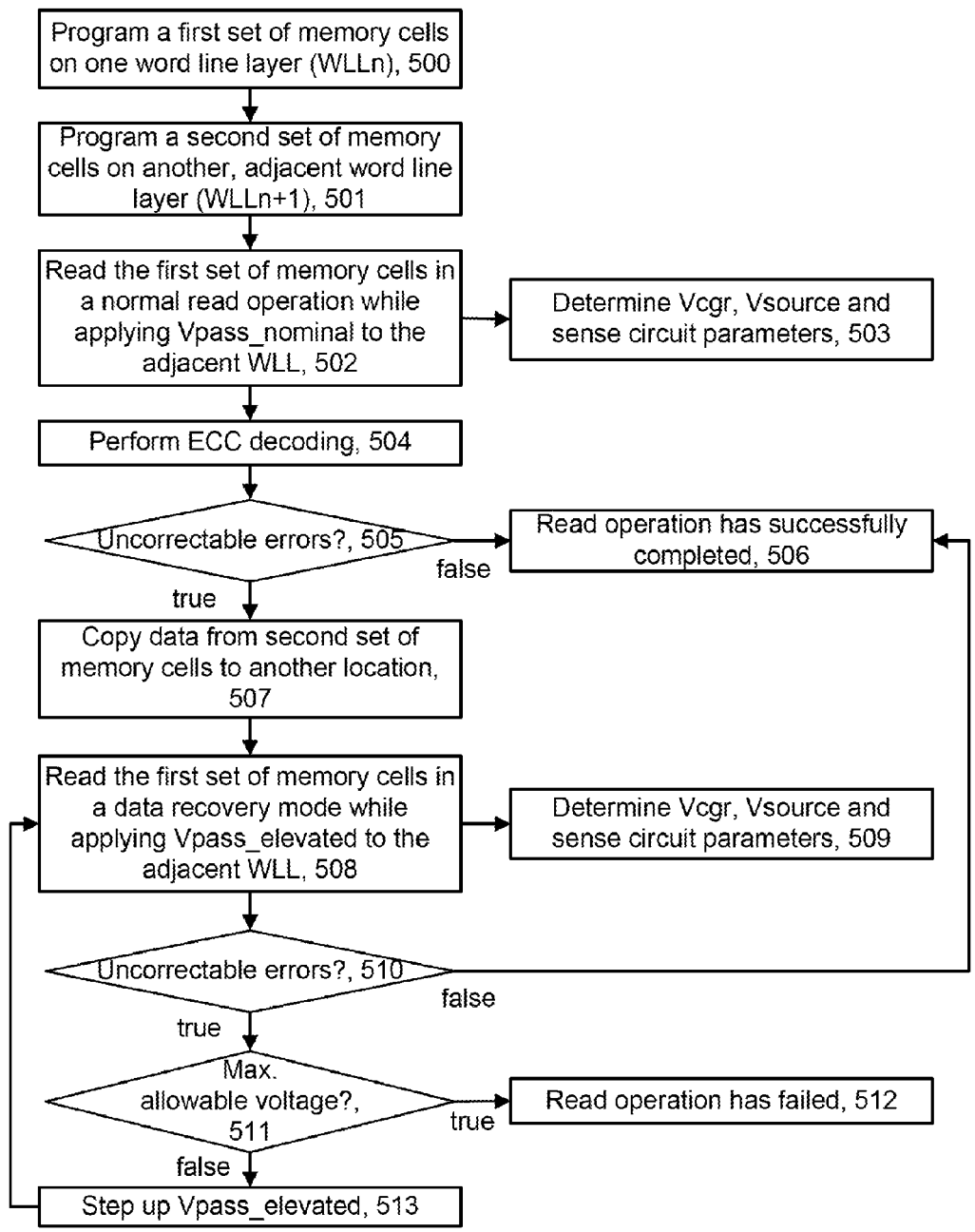
FIG. 5A depicts a process for programming and reading memory cells in a memory device.

FIG. 5A depicts a process for programming and reading memory cells in a memory device. Step 500 involves programming a first set of memory cells on one word line layer (WLLn). Step 501 involves programming a second set of memory cells on another word line layer (WLLn+1) which is adjacent to (e.g., above or below) the one word line layer (WLL). In one example programming sequence, the programming proceeds one word line layer at a time starting from a bottom word line layer, and moving sequentially to each next higher word line layer. In this case, the programming of cells on a particular word line layer causes program disturb to the cells on the word line below the particular word line layer. Step 502 includes reading the first set of cells in a normal read operation while applying Vpass_nominal (e.g., 8 V) to the adjacent WLL. A normal read operation refers to a read operation in which it has not yet been determined that the cells contain one or more uncorrectable errors. In connection with step 502, step 503 determines Vcgr, Vsource and sensing circuit parameters. These parameters can be set at nominal levels. A nominal level is used during a normal read operation.

Step 504 performs ECC decoding on the data read from the first set of memory cells, e.g., to correct errors and to determine if there are one or more uncorrectable errors. Various types of ECC codes can be used. Some codes have the ability to detect and correct errors. In some cases, the number of errors which can be detected exceeds the number of errors which can be corrected. Thus, some errors are correctable and some are uncorrectable. For example, Hamming codes have a minimum distance of 3, which means that the code can detect and correct a single bit error, or detect but not correct two bit errors. The extended Hamming code adds an extra parity bit to increase the minimum distance to 4. This code can distinguish between single bit errors and two-bit errors. Thus, the code can detect and correct a single error and at the same time detect (but not correct) a two-bit error. Or, the code can detect up to 3 errors without correction. In practice, a unit of data such as a page can be encoded using ECC by a control or state machine and stored in a set of memory cells in an encoded form. The corresponding decoding process is performed on the unit of data when it is read. In this example, one bit error can be corrected and two bit errors can be detected.

In another example, portions of the unit of data such as sub-pages are encoded separately using the ECC. The corresponding decoding process is performed on each portion of the unit of data when it is read. In this example, one bit error can be corrected and two bit errors can be detected for each portion. For example, with eight portions, a total of eight bit errors can be corrected and sixteen bit errors can be detected for the unit of data. A count of errors can include uncorrectable errors only, or both uncorrectable and correctable errors.

Decision step 505 determines if there are one or more uncorrectable errors. This situation is generally unacceptable since the data which was read will not be the same as the data which was programmed. If decision step 505 is false, the read operation has successfully completed at step 506. If decision step 505 is true, data from the second set of memory cells is copied from WLLn+1 to another location (e.g., a backup location), such as another WLL in the same sub-block or block, or in another block, at step 507. This preserves the data from the second set of memory cells so that it is not corrupted by the use of an elevated Vpass on WLLn+1. If Vpass_elevated becomes too high, it can cause read disturb on the cells of WLLn+1.

Subsequently, the first set of memory cells is read in a data recovery mode in which Vpass_elevated is applied to the adjacent WLL, at step 508. The effect of applying an elevated Vpass in place of the nominal Vpass is discussed further below. Generally, it helps to narrow and separate the Vt distributions of each data state stored by the first set of memory cells so that it is more probable that the data can be read without uncorrectable errors. In connection with step 508, step 509 determines Vcgr, Vsource and sensing circuit parameters. These parameters can be set at levels which are different than the nominal levels, as discussed further below.

Decision step 510 determines if there are one or more uncorrectable errors. If decision step 510 is false, the read operation has successfully completed at step 506. If decision step 510 is true, decision step 511 determines whether a maximum allowable voltage has been reached by Vpass_elevated. Alternatively, a maximum allowable number of data recovery read operations may be enforced. If decision step 511 is true, the read operation has failed, at step 512. If decision step 511 is false, step 513 steps up Vpass_elevated and another data recovery read operation is performed at step 508. Vpass_elevated can be stepped up using various approaches, as discussed further below. Moreover, Vpass_elevated can be tailored to the level of Vcgr or to the data states being distinguished, as discussed further below.

Figure 5B:
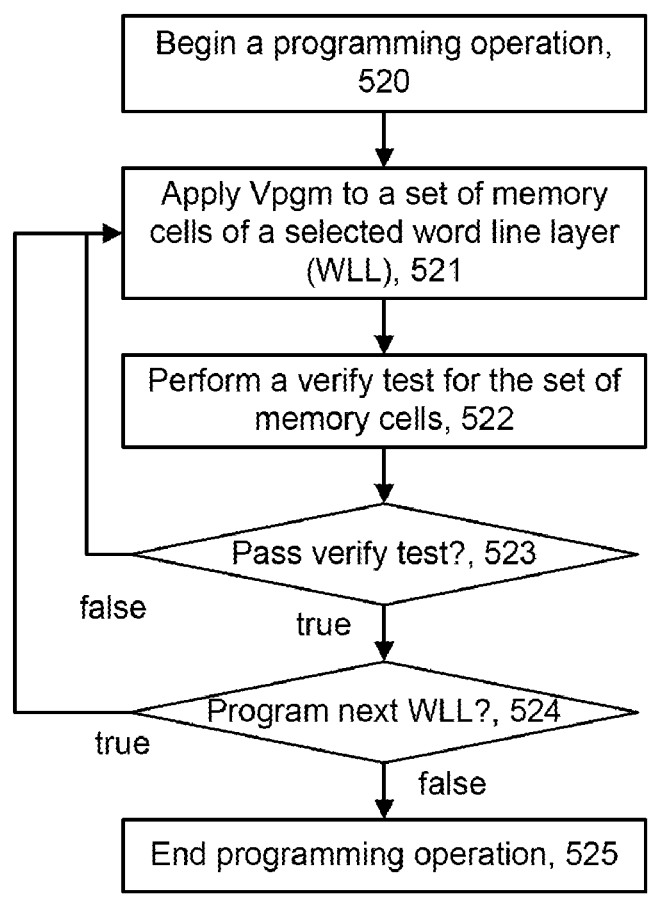
FIG. 5B depicts an example of a programming operation consistent with step 500 of FIG. 5A.

FIG. 5B depicts an example of a programming operation consistent with step 500 of FIG. 5A. A programming operation begins at step 520. Step 521 includes applying Vpgm to a set of memory cells on a selected WLL. Step 522 includes performing a verify test for the set of memory cells. For example, sensing circuitry which is connected to the bit lines can be used to sense a conductive or non-conductive state of the cells. A cell which is in a non-conductive state has passed a verify test and is locked out from further programming. Decision step 523 determines whether the set of memory cells has passed the verify test. Typically, this requires that all, or almost all of the cells have passed their respective verify tests. If decision step 523 is false, a next programming pulse is applied at step 521. If decision step 523 is true, decision step 524 determines whether there is a next WLL to program. If decision step 524 is false, the programming operation has ended at step 525. If decision step 524 is true, a next programming pulse is applied at step 521.

Figure 6A:
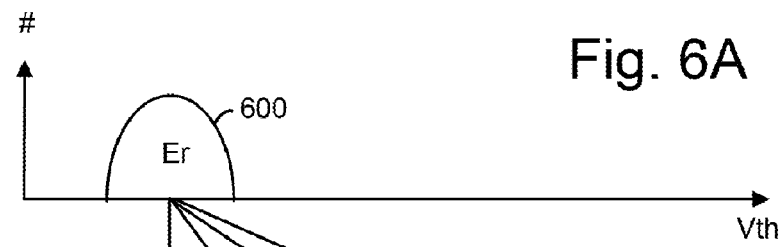
FIGS. 6A and 6B depict a one pass programming operation with four data states consistent with FIG. 5B.
Figure 6B:
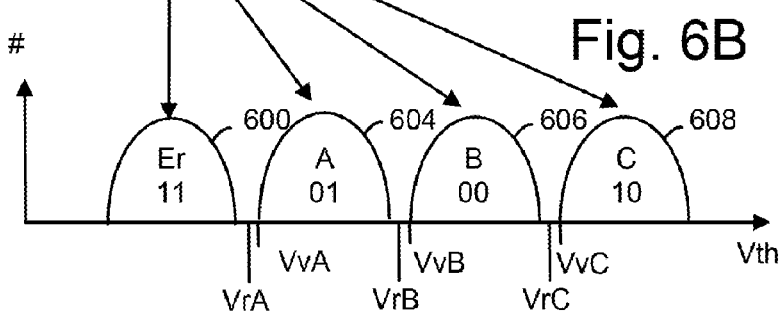

FIGS. 6A and 6B depict a one pass programming operation with four data states consistent with FIG. 5B. One pass programming involves a sequence of multiple program-verify operations which are performed starting from an initial Vpgm level and proceeding to a final Vpgm level until the threshold voltages of a set of selected memory cells reach one or more respective verify levels of respective target data states. All memory cells are initially in an erased state. Some of the memory cells are not programmed and remain in the erased state while others are programmed to higher target data states.

Example Vth distributions for the memory cell array are provided for a case where each memory cell stores two bits of data. Each graph depicts Vth on the horizontal axis and a number or population of memory cells in a Vth distribution on the vertical axis. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A first Vth distribution 600 is provided for erased (Er) state memory cells. Three Vth distributions 604, 606 and 608 represent target data states A, B and C, respectively, which are reached by memory cells when their Vth exceeds the verify level VvA, VvB or VvC, respectively. In this case, each memory cell can store two bits of data in one of four possible Vth ranges, referred to as states Er (or E), A, B and C.

The specific relationship between the data programmed into a memory cell and the Vth level of the memory cell depends upon the data encoding scheme adopted for the memory cells. In one embodiment, data values are assigned to the Vth ranges using a Gray code assignment so that if the Vth of a floating gate erroneously shifts to its neighboring physical state, only one bit will be affected. One example assigns "11," "01," "00" and "10" to the E, A, B- and C-states. Read reference voltages which are between the distributions are used for reading data from the memory cells. By testing whether the Vth of a given memory cell is above or below one or more of the read reference voltages, the system can determine the data state which is represented by a memory cell.

Figure 7A:
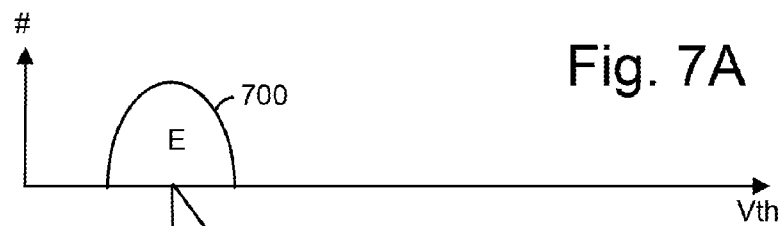
FIGS. 7A to 7C depict a two-pass programming operation with four data states consistent with FIG. 5B.
Figure 7B:
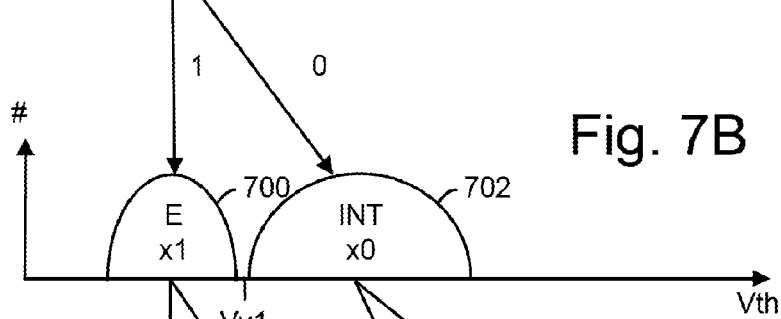
Figure 7C:
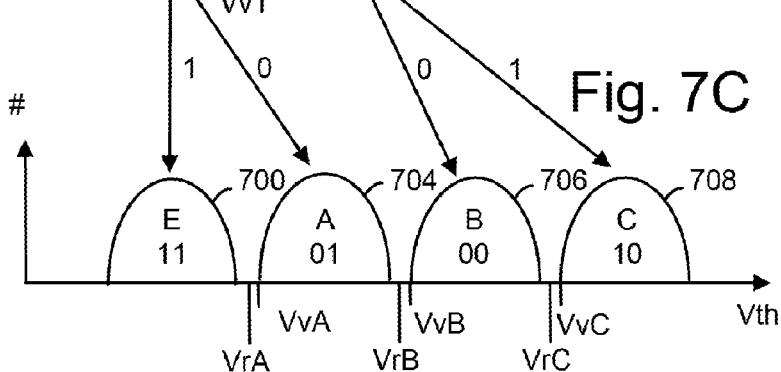

FIGS. 7A to 7C depict a two-pass programming operation with four data states consistent with FIG. 5B. Each pass can be used to program a page of data. For example, programming of lower and upper pages in two-bit, four-level memory cells is provided. Programming can be performed one logical page at a time, with the lower page followed by the upper page. Initially, all memory cells are in the Er state, represented by the distribution 700 in FIG. 7A.

FIG. 7B depicts programming of a lower page of data. If the lower page has a bit=1, the associated memory cell remains in the distribution 700 and the data is represented by x1, where x is an upper page bit that is not yet known. If the lower page has a bit=0, the memory cell is programmed to a higher Vth as represented by distribution 702, which is an interim distribution (INT), using a verify level Vv1. The data of these memory cells is represented by x0. Note that the interim distribution can be relatively wide since it is not a final distribution and does not represent a final data state.

FIG. 7C depicts programming of an upper page of data. If UP/LP=11, the associated memory cell in the distribution 700 remains in the distribution 700 and stores data bits 11. If UP/LP=01, the memory cells in the distribution 700 are programmed to the distribution 704. If UP/LP=10, the memory cells in the distribution 702 are programmed to the distribution 708 (state C). If UP/LP=00, the memory cells in the distribution 702 are programmed to the distribution 706 (state B).

Programming can be similarly extended to three or more bits per memory cell.

FIG. 8 depicts program and verify voltages in a programming operation, consistent with FIG. 5B. A programming operation may include multiple program-verify iterations or loops, where each program-verify iteration includes a programming portion comprising a program pulse and a following verify operation comprising one or more verify voltages. The program pulse and verify voltages are applied to a selected WLL.

In one approach, the program pulses are stepped up in successive iterations by a step size, dVpgm. Moreover, each program pulse may include a first portion which has a pass voltage (Vpass) level, e.g., 6-8 V, followed by a second, peak amplitude portion at a program level, e.g., 12-25 V. For example, this programming pass includes program pulses 801-805 and associated sets of verify pulses 811-815, respectively. The initial program pulse has a magnitude of Vpgm_initial. In this example, the verify pulses have a magnitude of VvA, VvB and VvC.

Figure 9A:
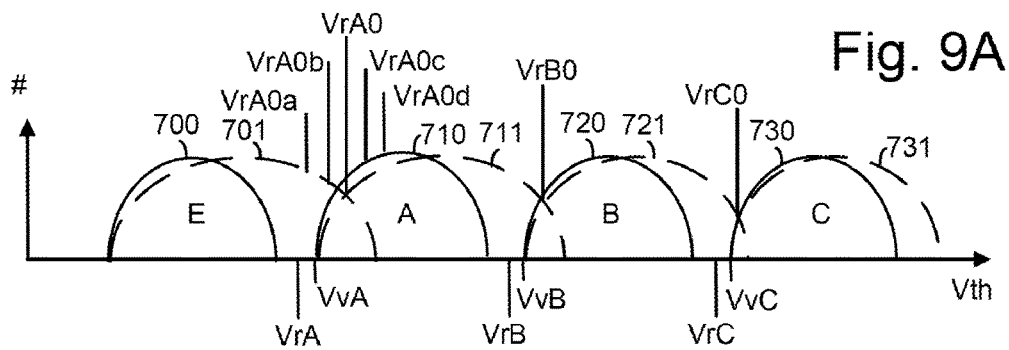
FIG. 9A depicts a change in a Vt distribution of a first set of memory cells on a word line layer WLLn after programming of an adjacent second set of memory cells on a word line layer WLLn+1.

FIG. 9A depicts a change in a Vt distribution of a first set of memory cells on a word line layer WLLn after programming of an adjacent second set of memory cells on a word line layer WLLn+1. The Vt distributions 700, 710, 720 and 730 are depicted for the E, A, B and C states, respectively, of the first set of memory cells, before programming the second set of memory cells. The Vt distributions 701, 711, 721 and 731 are depicted for the E, A, B and C states, respectively, of the first set of memory cells, after programming the second set of memory cells. The Vt distributions of FIG. 9A-9D are simplifications. Actual test data is provided further below. Generally, the Vt distributions are widened due to program disturb caused by programming the adjacent cells.

If the set of control read voltages which includes VrA, VrB and VrC is used to read the cells after they have been disturbed, a large number of errors can result because these read voltages are optimized for a non-disturbed set of cells. To reduce the number of errors, the read levels can be adaptively set based on the current Vt distribution, in a first (normal) read operation. In this approach, several sensing operations are performed to an optimum read level between adjacent data states. For example, sensing operations can be performed using control gate voltages of VrA0$a$, VrA0$b$, VrA0, VrA0$c$ and VrA0$d$. Error correction decoding is performed on data read for each control gate voltage of a plurality of different control gate voltages, and an optimum control gate voltage (e.g., VrA0) which results in a minimum number of errors is selected from among the plurality of different control gate voltages. Typically, the optimum control gate voltage will be at a minimum point in the Vt distribution between adjacent data states. Similarly, VrB0 is an optimum read voltage between the A and B states, and VrC0 is an optimum read voltage between the B and C states.

However, even with the optimum read levels, there will be some read errors. For example, for some of the E state cells, the Vt exceeds VrA0 and these cells will be incorrectly read as being A state cells. For some of the A state cells, the Vt is less than VrA0 and these cells will be incorrectly read as being E state cells.

Figure 9B:
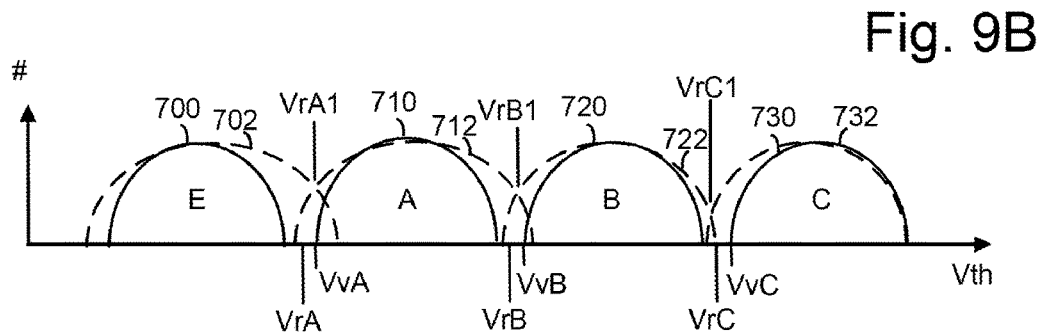
FIG. 9B depicts a change in a threshold voltage (Vt) distribution of the first set of memory cells in a second read operation (a first data recovery read operation) which follows FIG. 9A.

FIG. 9B depicts a change in a Vt distribution of the first set of memory cells in a second read operation (a first data recovery read operation) which follows FIG. 9A. When Vpass_elevated is applied to second set of memory cells, this causes a shift in the Vt distribution of the first set of memory cells. In particular, the Vt distribution is lowered and somewhat narrowed. The effect is more pronounced for the lower data states. The Vt distributions 701, 711, 721 and 731 of FIG. 9A become the Vt distributions 702, 712, 722 and 732 of FIG. 9B. The optimum read voltages can again be adaptively determined, this time as VrA1, VrB1 and VrC1.

Figure 9C:
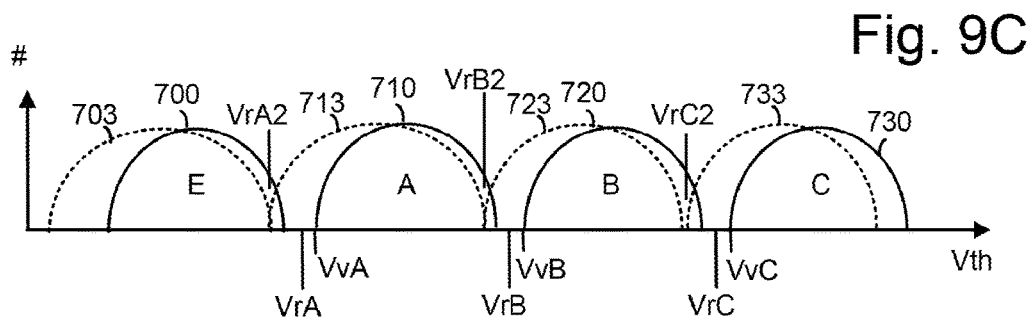
FIG. 9C depicts a change in a Vt distribution of the first set of memory cells in a third read operation (a second data recovery read operation) which follows FIG. 9B.

FIG. 9C depicts a change in a Vt distribution of the first set of memory cells in a third read operation (a second data recovery read operation) which follows FIG. 9B. When a stepped up Vpass_elevated is applied to second set of memory cells, this cause a further lowering and narrowing in the Vt distribution of the first set of memory cells. The Vt distributions 702, 712, 722 and 732 of FIG. 9B become the Vt distributions 703, 713, 723 and 733 of FIG. 9C. The optimum read voltages can again be adaptively determined, this time as VrA2, VrB2 and VrC2. Note that the optimum read voltages also typically become lower with each successive read operation.

Figure 9D:
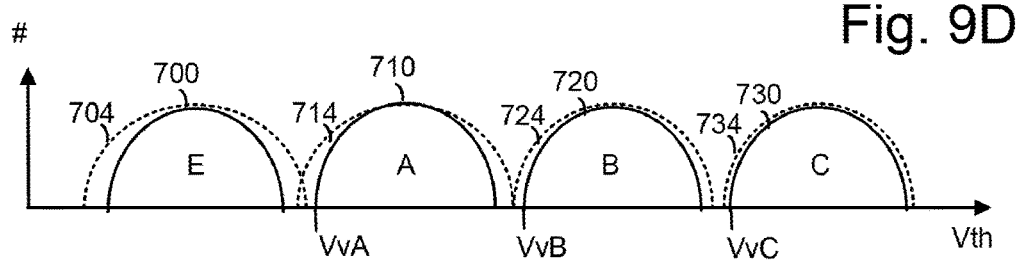
FIG. 9D depicts the Vt distributions 703, 713, 723 and 733 of FIG. 9C aligned with the Vt distributions 700, 710, 720 and 730 of FIG. 9A.

FIG. 9D depicts the Vt distributions 703, 713, 723 and 733 of FIG. 9C aligned with the Vt distributions 700, 710, 720 and 730 of FIG. 9A. The aligned Vt distributions are 704, 714, 724 and 734. This indicates that the Vt distributions are somewhat wider than the non-disturbed distributions 700, 710, 720 and 730 of FIG. 9A, but advantageously narrower than the disturbed distributions 701, 711, 721 and 731 of FIG. 9A.

Figure 10A:
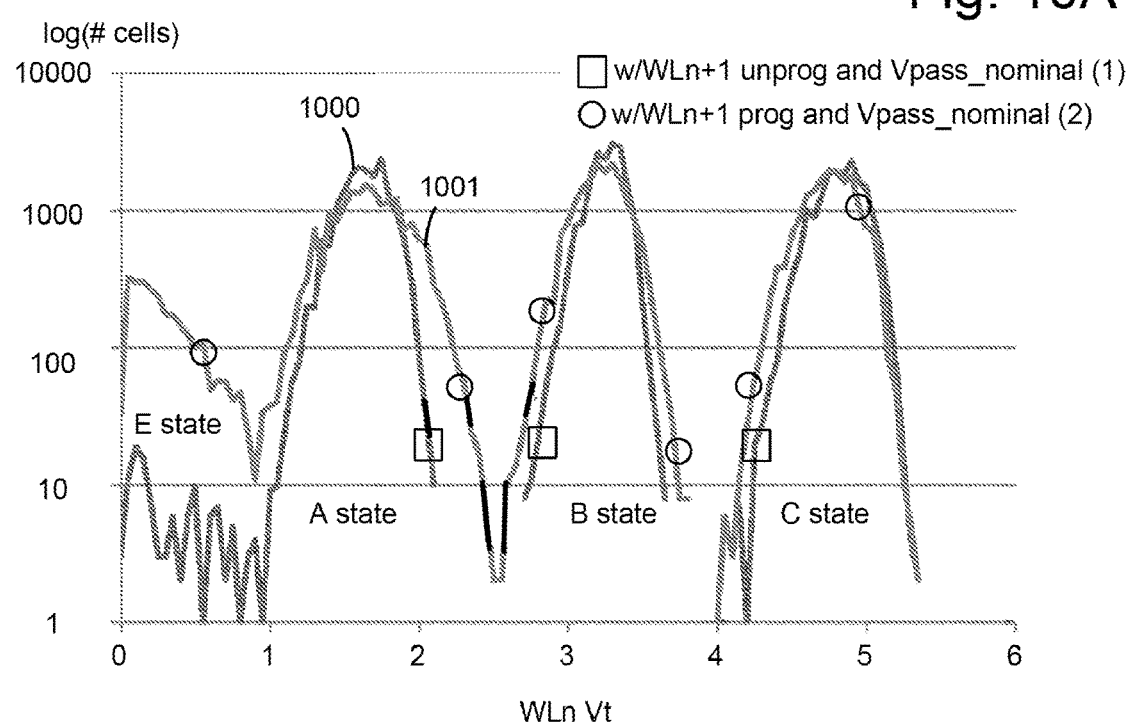
FIG. 10A depicts a Vt distribution from test data of a first set of memory cells on WLLn before and after programming of an adjacent second set of memory cells on WLLn+1, where: (1) WLLn+1 is unprogrammed and Vpass_nominal is used on WLLn+1 when WLLn is read, and (2) WLLn+1 is programmed and Vpass_nominal is used on WLLn+1 when WLLn is read.

FIG. 10A depicts a Vt distribution from test data of a first set of memory cells on WLLn before and after programming of an adjacent second set of memory cells on WLLn+1, where: (1) WLLn+1 is unprogrammed and Vpass_nominal is used on WLLn+1 when WLLn is read (see line 1000 with the square symbols), and (2) WLLn+1 is programmed and Vpass_nominal is used on WLLn+1 when WLLn is read (see line 1001 with the circle symbols). The plot depicts the Vt of a set of cells on WLLn on the horizontal x-axis and a number of cells on the vertical axis using a logarithmic scale.

The plot indicates that the Vt is widened for each state. The widening is greatest for the A state, and less for the B and C states. Moreover, the C state distribution is widened primarily on its lower end. The widening of the Vt distribution is due to program disturb. In particular, this program disturb is not observed until the spacing between memory cells becomes very small, such as less than 20 nm. For example, the program disturb was not observed for a cell spacing of 25-40 nm.

Figure 10B:
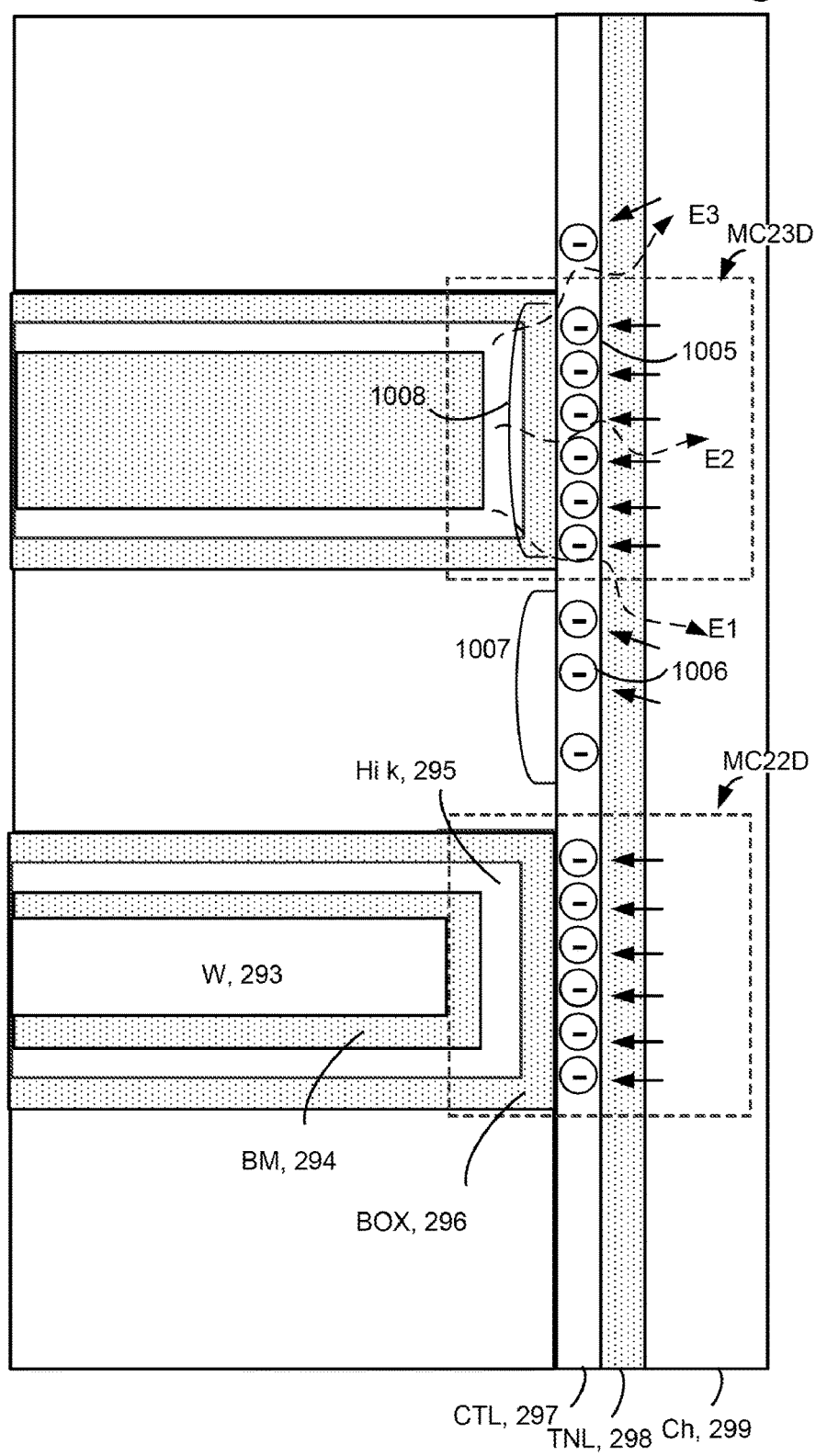
FIG. 10B depicts a close up view of a portion of the example memory cells MC22D and MC23D of FIG. 3B, showing electron injection in a charge trapping layer between memory cells.

FIG. 10B depicts a close up view of a portion of the example memory cells MC22D and MC23D of FIG. 3B, showing electron injection in a charge trapping layer between memory cells. In this program disturb model, when MC23D on a neighbor WLL (e.g., WLLn+1) is programmed, a strong fringing field is caused by the use of a high Vpgm on WLLn+1. The application of Vpgm results in a primary electromagnetic field E2 which causes electron injection from the channel 299 to a portion 1008 of the charge trapping layer 297 which is within the memory cell MC23D, e.g., adjacent to the WLL. See example electron 1005. However, fringing fields E1 and E3 are also generated which cause electron injection from the channel 299 to portions of the charge trapping layer 297 which are outside the memory cell MC23D. See example electron 1006 in a portion 1007 of the charge trapping layer which is between the memory cells MC23D and MC22D.

These charges can result in a parasitic memory cell which has a threshold voltage. As a result, during a read operation on WLLn, a higher control gate voltage may be needed to provide a fringing field from MC22D which causes the parasitic cell to become conductive and to thereby allow sensing of MC22D. The control gate voltages used for the lower data states may not be sufficient to cause the parasitic cell to become highly conductive. As a result, reading of lower data states can be significantly impaired. On the other hand, the control gate voltages used for the higher data states may be sufficient to cause the parasitic cell to become highly conductive, so that reading of higher data states is impaired by a smaller amount.

Note that the charge trapping layer extends vertically in this example and the word line layers extend horizontally. However, other configurations are possible. For example, the charge trapping layer could extend horizontally while the word line layers extend vertically.

Figure 10C:
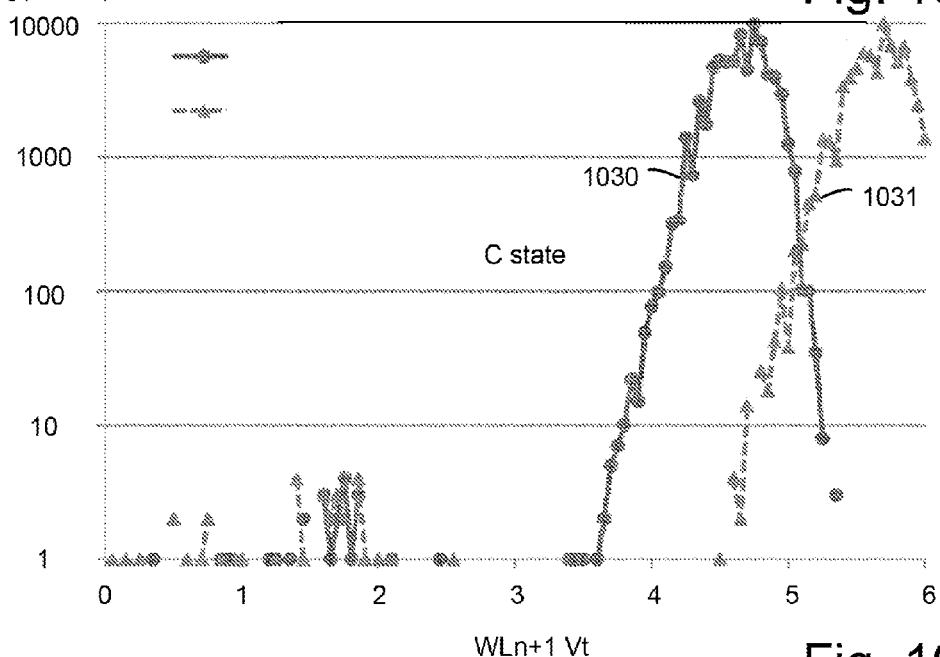
FIG. 10C depicts a Vt distribution from test data of a second set of memory cells on WLLn+1 after programming to an all C state data pattern using: (3) a lower verify level (e.g., 4.5 V, see line 1030) and (4) a higher verify level (e.g., 5.5 V, see line 1031).

FIG. 10C depicts a Vt distribution from test data of a second set of memory cells on WLLn+1 after programming to an all C state data pattern using: (3) a lower verify level (e.g., 4.5 V, see line 1030) and (4) a higher verify level (e.g., 5.5 V, see line 1031). The plot depicts the Vt of a set of cells on WLLn+1 on the horizontal x-axis and a number of cells on the vertical axis using a logarithmic scale. This figure shows programming on WLLn+1 to determine the amount of program disturb on WLLn (FIG. 10D).

Figure 10D:
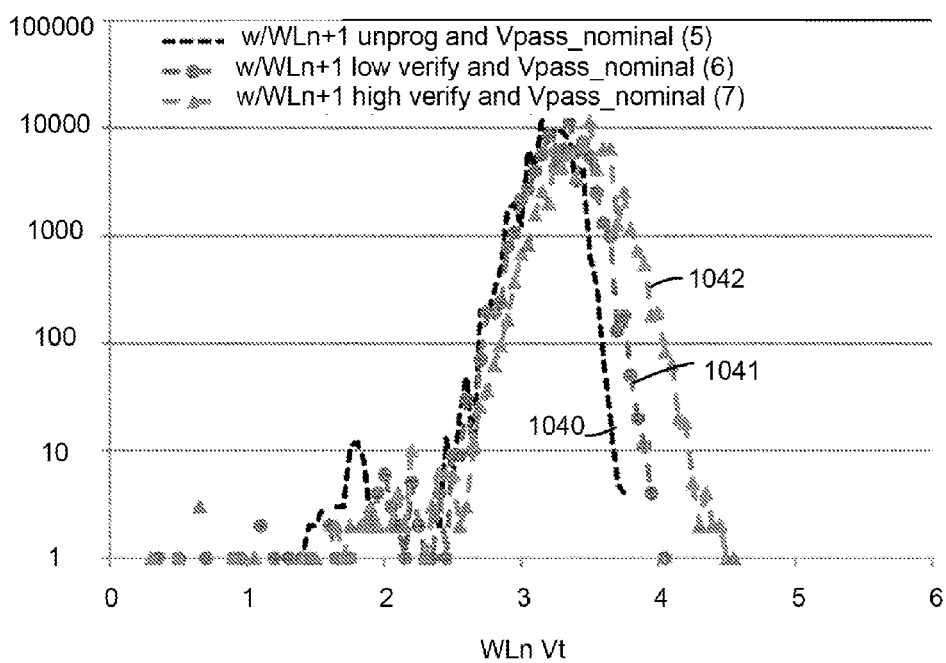
FIG. 10D depicts a Vt distribution from test data of a first set of memory cells on WLLn where: (5) WLLn+1 is unprogrammed and Vpass_nominal is used on WLLn+1 when WLLn is read, (6) WLLn+1 is programmed using the low verify of case (3) and Vpass_nominal is used on WLLn+1 when WLLn is read, and (7) WLLn+1 is programmed using the high verify of case (4) and Vpass_nominal is used on WLLn+1 when WLLn is read.

FIG. 10D depicts a Vt distribution from test data of a first set of memory cells on WLLn where: (5) WLLn+1 is unprogrammed and Vpass_nominal is used on WLLn+1 when WLLn is read (see line 1040), (6) WLLn+1 is programmed using the low verify of case (3) and Vpass_nominal is used on WLLn+1 when WLLn is read (see line 1041), and (7) WLLn+1 is programmed using the high verify of case (4) and Vpass_nominal is used on WLLn+1 when WLLn is read (see line 1042). The plot depicts the Vt of a set of cells on WLLn on the horizontal x-axis and a number of cells on the vertical axis using a logarithmic scale.

Specifically, case (5) represents the original Vt distribution of the cells on WLLn after completion programming on WLLn. The cells on WLLn were programmed to an all B state data pattern using a verify level of 3 V. Case (6) represents a change in the distribution of case (5) due to programming of the cells of WLLn+1 to an all C state data pattern using a verify level of 4.5 V. Case (7) represents a change in the distribution of case (5) due to programming of the cells of WLLn+1 to an all C state data pattern using a verify level of 5.5 V. The Vt of the cells on WLLn increase by about 0.2 V in case (6) and by about 0.5 V in case (7), at the three-sigma point of the Vt distributions 1041 and 1042, respectively. Since a voltage change on WLLn+1 of 4.5–3=1.5 V causes a 0.2 V change on WLLn, and a voltage change on WLLn+1 of 5.5–3=2.5 V causes a 0.5 V change on WLLn, the increase in Vt due to program disturb is non-linear with the programming depth (voltage swing) of the cells on WLLn+1. That is, the ratio of program disturb to the voltage change on WLLn _1 is 0.2/1.5=0.13 in one case and 0.5/2.5=0.20 in another case. This indicates the program disturb effect cannot be resolved by countermeasures for linear program disturb effects such as might be seen in floating gate cells.

FIG. 10E depicts a Vt distribution from test data of a first set of memory cells on WLLn where: (8) WLLn+1 is unprogrammed and Vpass_nominal is used on WLLn+1 when WLLn is read (see line 1052 and the upright triangle symbols), (9) WLLn+1 is programmed and Vpass_nominal is used on WLLn+1 when WLLn is read (see line 1050 and the circle symbols), (10) WLLn+1 is unprogrammed and Vpass_elevated is used on WLLn+1 when WLLn is read (see line 1053 and the inverted triangle symbols), and (11) WLLn+1 is programmed and Vpass_elevated is used on WLLn+1 when WLLn is read (see line 1051 and the square symbols). The plot depicts the Vt of a set of cells on WLLn on the horizontal x-axis and a number of cells on the vertical axis using a logarithmic scale.

This graph shows the effect of using Vpass_elevated on WLLn+1, when reading the cells on WLLn. There is not a significant difference in the Vt of the cells on WLLn based on whether Vpass_nominal or Vpass_elevated is applied to WLLn+1, when the cells of WLLn+1 have not been programmed (cases (8) and (10) are similar). This is true because no parasitic cell has been created. However, there is a narrowing of the Vt of the cells on WLLn, especially for the A state, when Vpass_elevated instead of Vpass_nominal is applied to WLLn+1, and when the cells of WLLn+1 have been programmed so that a parasitic cell has been created. As an example, Vpass_nominal is about 8 V and Vpass_elevated is about 12 V.

For a given data state, the Vt distribution is narrowed because Vpass_elevated causes a larger downshift in the high part of the distribution than in the low part. As mentioned, a parasitic cell is created between a memory cell on WLLn and a memory cell on WLLn+1 when the cell on WLLn+1 is programmed using a high Vpgm. The parasitic cell acts as a resistance between the memory cells and the resistance is higher when the cell on WLLn+1 is programmed to a higher state such as the C state). This causes a higher upshift in the Vt of the cell on WLLn than if the cell on WLLn+1 was programmed to a low state such as the A state. Further, there may be no upshift in the Vt of the cell on WLLn if the cell on WLLn+1 remains in the erase state. See also FIG. 9A. Subsequently, when Vpass_elevated is applied to WLLn+1 while reading the cell on WLLn, the parasitic cell is provided in a less resistive, conducive state so that the effect of the parasitic cell is largely removed. As a result, there is a large downshift in the Vt of the cells in the high part of the distribution than in the Vt of the cells in the low part of the distribution, resulting in a narrowing of the Vt distribution. The narrowing effect due to Vpass_elevated is therefore stronger when the widening effect due to the parasitic cell is stronger.

The techniques provided herein provide a system-level data rescue solution for highly-scaled 3D stacked non-volatile memory devices. In these techniques, when the ECC decoding indicates there are one or more uncorrectable errors in the data read from the cells on WLLn while WLLn+1 is biased at Vpass_nominal, a recovery process is initiated. The process can involve multiple read attempts, where Vpass_elevated becomes progressively higher with each attempt, until the ECC decoding indicates there are no uncorrectable errors, or until Vpass_elevated reaches a limit. As mentioned, the initial value of Vpass_elevated can be significantly higher than Vpass_nominal, e.g., 12 V vs. 8 V. Vpass_elevated can increase in steps of 3 V, for instance, so that the next value of Vpass_elevated is 15 V and then 18 V, which may be the maximum allowed value. In this case, up to three data recovery read operations can be used.

As mentioned, the Vt distribution is shifted lower on the cells of WLLn by the use of Vpass_elevated on WLLn+1. To compensate, Vcgr can also be shifted lower. In the adaptive approach, an optimum Vcgr can be determined for distinguishing between each pair of adjacent data states. In another approach, Vcgr can be shifted lower by predetermined amounts for each pair of adjacent data states. The shifts can be the same or vary for each data recovery read operation. Further, the shifts can be different for the different states, with the lower states having a larger shift.

The amount of the shift can be expressed by Y=nX, where n is the sensitivity of the Vt of the cells on WLLn to Vcgr on WLLn+1, and is specific to the memory device. X is the difference between Vpass_elevated−Vpass_nominal. For example, if n is 0.1 V/V and Vpass_elevated−Vpass_nominal=12−8=4 V, then Y=0.4 V. Y is the difference in Vcgr on WLn.

Another option to compensate for the Vt distribution being shifted lower is to increase Vsource, the bias of the source end of the NAND string and of the source terminals of the cells being read, above a nominal level by the above-mentioned voltage Y. Other options to compensate for the Vt distribution being shifted lower on the cells of WLLn include adjusting parameters in the sensing circuitry, as discussed further below.

Figure 10F:
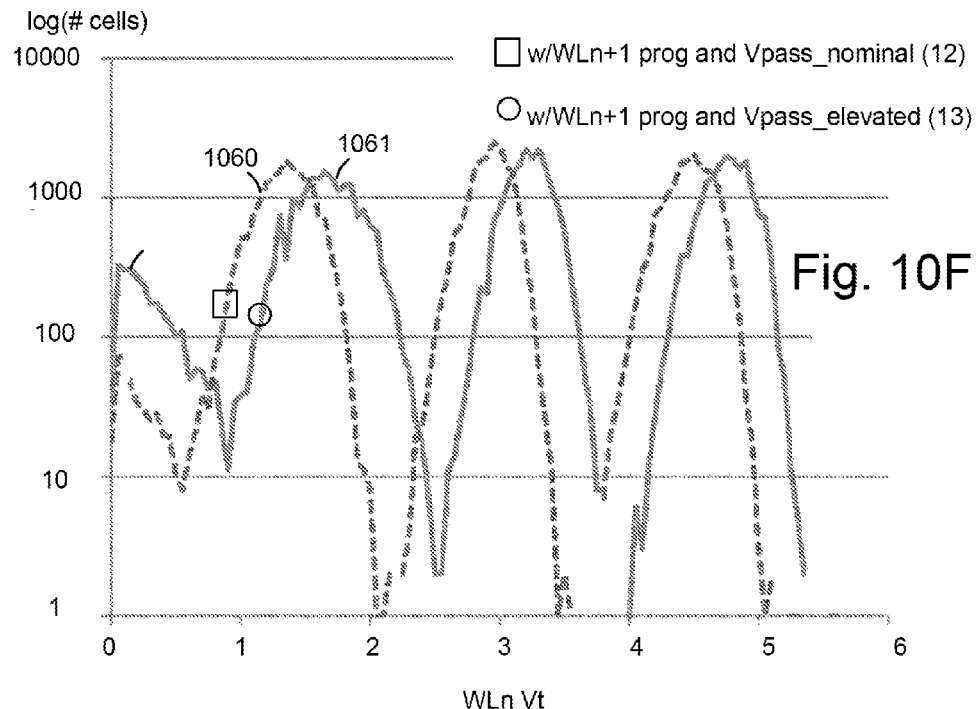
FIG. 10F depicts a Vt distribution from test data of a first set of memory cells on WLLn where: (12) WLLn+1 is programmed and Vpass_nominal is used on WLLn+1 when WLLn is read, (13) WLLn+1 is programmed and Vpass_elevated is used on WLLn+1 when WLLn is read.

FIG. 10F depicts a Vt distribution from test data of a first set of memory cells on WLLn where: (12) WLLn+1 is programmed and Vpass_nominal is used on WLLn+1 when WLLn is read (see line 1060 and the square symbols), (13) WLLn+1 is programmed and Vpass_elevated is used on WLLn+1 when WLLn is read (see line 1061 and the circle symbols). The plot depicts the Vt of a set of cells on WLLn on the horizontal x-axis and a number of cells on the vertical axis using a logarithmic scale.

Figure 10G:
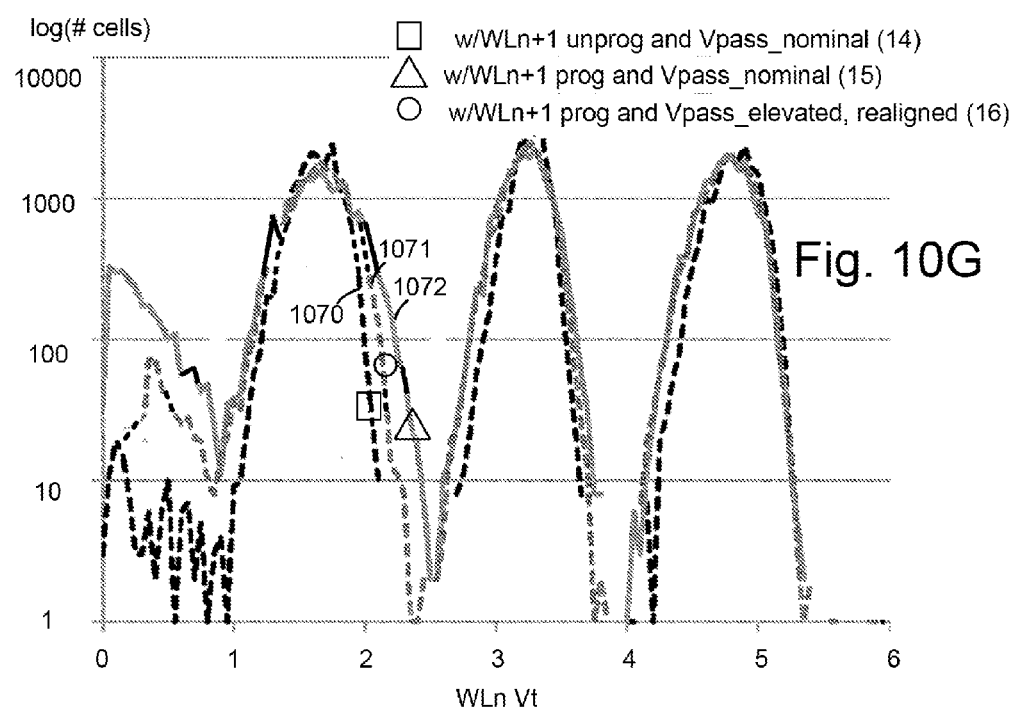
FIG. 10G depicts a Vt distribution from test data of a first set of memory cells on WLLn where: (14) WLLn+1 is unprogrammed and Vpass_nominal is used on WLLn+1 when WLLn is read, (15) WLLn+1 is programmed and Vpass_nominal is used on WLLn+1 when WLLn is read, and (16) WLLn+1 is programmed and Vpass_elevated is used on WLLn+1 when WLLn is read, and the Vt distribution is aligned with the Vt distributions of cases (14) and (15).

Referring also to FIG. 10G, in this example, the cells of WLLn were programmed while biasing WLLn+1 at Vpass_nominal, then the cells of WLLn+1 were programmed while biasing WLLn at Vpass_nominal. In case (12), the cells of WLLn were read while biasing WLLn+1 at Vpass_nominal. In case (13), the cells of WLLn were read while biasing WLLn+1 at Vpass_elevated. These results show the decrease in the Vt of the cells on WLLn due to the use of Vpass_elevated.

FIG. 10G depicts a Vt distribution from test data of a first set of memory cells on WLLn where: (14) WLLn+1 is unprogrammed and Vpass_nominal is used on WLLn+1 when WLLn is read (see line 1070 and the square symbols), (15) WLLn+1 is programmed and Vpass_nominal is used on WLLn+1 when WLLn is read (see line 1072 and the triangle symbols), and (16) WLLn+1 is programmed and Vpass_elevated is used on WLLn+1 when WLLn is read, and the Vt distribution is aligned with the Vt distributions of cases (14) and (15) (see line 1071 and the circle symbols). The plot depicts the Vt of a set of cells on WLLn on the horizontal x-axis and a number of cells on the vertical axis using a logarithmic scale. These results show that the Vt distribution of the cells on WLLn was successfully narrowed with the Vpass_elevated applied to WLLn+1. By narrowing the Vt distribution, the number of read errors can be reduced.

FIG. 11A depicts a control gate voltage on WLLn as a function of time during a read operation for distinguishing four data states in a first set of memory cells on WLLn, consistent with FIG. 5A. The horizontal axis depicts time and the vertical axis depicts a voltage on WLLn. In a read operation, each selected cell to be read is biased in a way which indicates the Vt of the cell. The terminals of a cell include the control gate, drain and source. In one approach, the selected cell is in a NAND string, one end of the NAND string is connected to sensing circuitry via a bit line and the other end of the NAND string is connected to a source line. By providing the unselected cells in the NAND string in a conductive state, the drain of the selected cell can be biased by a voltage at the sensing circuitry and the source of the selected cell can be biased by a voltage at the source line. The control gate of the selected cell can be biased by a control gate read voltage (Vcgr) on WLLn. To distinguish between n=4 different data states, n−1=3 different levels of Vcgr can be applied to WLLn in turn.

To distinguish between the E and A states (E/A read), Vcgr_A is applied to WLLn and the sensing circuitry is used to determine whether each cell is in a conductive state. If a cell is in a conductive state, this indicates its Vt>Vcgr_A. If a cell is in a non-conductive state, this indicates its Vt<=Vcgr_A. Similarly, to distinguish between the A and B states (A/B read), Vcgr_B is applied to WLLn, and to distinguish between the B and C states (B/C read), Vcgr_C is applied to WLLn.

As mentioned, a higher Vpass on WLLn+1 results in a decrease in the Vt distribution on WLLn. Accordingly, Vcgr will be lower for each successive read operation. Vcgr can also be lowered for each successive read operation by setting it adaptively or based on predetermined decreases. Thus, during the first read operation, the E/A read is performed in which Vcgr_A is applied to WLLn at the level of line 1101, the A/B read is performed in which Vcgr_B is applied to WLLn at the level of line 1102, and the B/C read is performed in which Vcgr_C is applied to WLLn at the level of line 1103. During the second read operation, the E/A read is performed in which Vcgr_A is applied to WLLn at the level of line 1104, the A/B read is performed in which Vcgr_B is applied to WLLn at the level of line 1105, and the B/C read is performed in which Vcgr_C is applied to WLLn at the level of line 1105. During the third read operation, the E/A read is performed in which Vcgr_A is applied to WLLn at the level of line 1107, the A/B read is performed in which Vcgr_B is applied to WLLn at the level of line 1108, and the B/C read is performed in which Vcgr_C is applied to WLLn at the level of line 1109.

FIG. 11B depicts Vpass_elevated on WLLn+1 and Vpass_nominal on remaining unselected word line layers as a function of time during a read operation for a first set of memory cells on WLLn, time-aligned with FIG. 11A, and consistent with FIG. 5A. The horizontal axis depicts time and the vertical axis depicts Vpass_elevated. This example shows the first read operation which is a normal read operation, a second read operation which is a first data recovery read operation, and a third read operation which is a second data recovery read operation. Vpass_nominal is also depicted. In one example, Vpass_nominal is about 6-8 V and Vpass_elevated is between 10-18 V. Additionally, for each demarcation of adjacent data states in each read operation, two options are provided for Vcgr: a lower voltage is represented by a solid line and a higher voltage is represented by a dashed line. The higher or lower voltage, or an intermediate voltage, may be selected based on a factor such as a number of errors detected in the previous read operation.

For example, it may be desirable to provide a higher Vpass_elevated when there are a relatively large number of errors detected in the previous read operation. In this situation, a higher Vpass_elevated is used to more quickly bring down the number of errors. The initial level of Vpass_elevated as well as the step size of Vpass_elevated in a read operation may be a function of the number of errors in the previous read operation.

Additionally, the initial level of Vpass_elevated and the step size of Vpass_elevated can be a function of the data states being demarcated in a read operation. Generally, the initial level of Vpass_elevated and the step size of Vpass_elevated can be relatively higher when the amount of program disturb is higher, e.g., for a read which attempts to demarcate between adjacent lower data states (e.g., E/A read). The lower data states encompass an associated range of threshold voltages which are lower an associated range of threshold voltages for higher data states. The initial level of Vpass_elevated and the step size of Vpass_elevated can be relatively lower when the amount of program disturb is lower, e.g., for a read which attempts to demarcate between adjacent higher data states (e.g., A/B and B/C reads). The initial level of Vpass_elevated and the step size of Vpass_elevated can thus be inversely proportional to the level of Vcgr in a read operation.

Thus, during the first read operation, the E/A read is performed in which Vcgr_A is applied to WLLn and Vpass_elevated at the level of line 1110 or 1111 is applied to WLLn+1. Vpass_nominal may be applied to the remaining word line layers, in one approach. The A/B read is performed in which Vcgr_B is applied to WLLn and Vpass_elevated at the level of line 1112 or 1113 is applied to WLLn+1. The B/C read is performed in which Vcgr_C is applied to WLLn and Vpass_elevated at the level of line 1114 or 1115 is applied to WLLn+1.

During the second read operation, the E/A read is performed in which Vcgr_A is applied to WLLn and Vpass_elevated at the level of line 1116 or 1117 is applied to WLLn+1. The A/B read is performed in which Vcgr_B is applied to WLLn and Vpass_elevated at the level of line 1118 or 1119 is applied to WLLn+1. The B/C read is performed in which Vcgr_C is applied to WLLn and Vpass_elevated at the level of line 1120 or 1121 is applied to WLLn+1.

During the third read operation, the E/A read is performed in which Vcgr_A is applied to WLLn and Vpass_elevated at the level of line 1122 or 1123 is applied to WLLn+1. The A/B read is performed in which Vcgr_B is applied to WLLn and Vpass_elevated at the level of line 1124 or 1125 is applied to WLLn+1. The B/C read is performed in which Vcgr_C is applied to WLLn and Vpass_elevated at the level of line 1126 or 1127 is applied to WLLn+1.

FIG. 11C depicts Vpass_elevated on WLLn+1 during a second read operation (a first data recovery read operation) for a first set of memory cells on WLLn, as a function of a number of errors during a first (normal) read operation, and consistent with FIG. 5A. The horizontal axis depicts a number of errors in a first (normal) read operation and the vertical axis depicts Vpass_elevated in a second read operation. As mentioned, the initial value of Vpass_elevated can be a function of the number of errors from the ECC decoding in the normal read operation. The initial value of Vpass_elevated can be adaptively set in proportion to the number of errors. The number of errors can be the number of uncorrectable errors, the number of detected errors or some other error metric. Generally, a higher number of errors indicates that a more aggressive Vpass_elevated is appropriate in the next read operation. This approach can result in completing the data recovery process with fewer read operations than when a less aggressive Vpass_elevated is used.

Furthermore, the initial value of Vpass_elevated can be a function of the data states which are being distinguished, e.g., a function of Vcgr, such that the initial value of Vpass_elevated is relatively higher when relatively lower data states are being distinguished. The initial value of Vpass_elevated is inversely proportional to Vcgr.

FIG. 11D depicts a step size for Vpass_elevated during a data recovery read operation for a first set of memory cells on WLLn, as a function of a number of errors during a previous read operation, and consistent with FIG. 5A. The horizontal axis depicts a number of errors in a previous read operation and the vertical axis depicts Vpass_elevated step size in a current read operation. As mentioned, the step size can be a function of the number of errors from the ECC decoding in the previous read operation. The step size can be proportional to the number of errors. Generally, a higher number of errors indicates that a more aggressive step size is appropriate in the next read operation. This approach can result in completing the data recovery process with fewer read operations than when a less aggressive step size is used. This approach adaptively sets the step size in proportion to the number of errors.

Furthermore, the step size can be a function of the data states which are being distinguished, e.g., a function of Vcgr, such that the step size is relatively higher when relatively lower data states are being distinguished. The step size is inversely proportional to Vcgr.

Figure 11E:
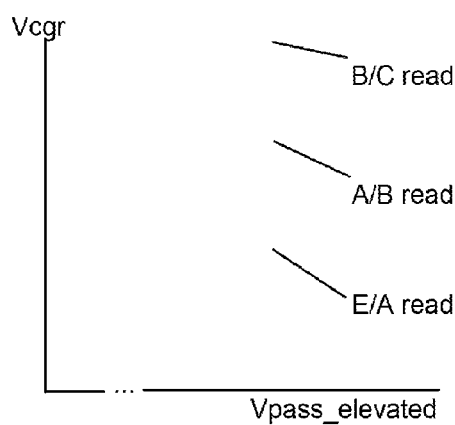
FIG. 11E depicts Vcgr on WLLn during a data recovery read operation for a first set of memory cells on WLLn, as a function of Vpass_elevated, and consistent with FIG. 5A.

FIG. 11E depicts Vcgr on WLLn during a data recovery read operation for a first set of memory cells on WLLn, as a function of Vpass_elevated, and consistent with FIG. 5A. The horizontal axis depicts Vpass_elevated and the vertical axis depicts Vcgr. As mentioned, one approach to optimizing Vcgr is to perform multiple sensing operations using different values for Vcgr to determine which value results in a minimum number of errors. However, this consumes time. To save time, Vcgr can be set for each data recovery read operation based on a predetermined decrease from a baseline level or from the level of a previous read operation. In this case, Vcgr can be optimized by making it inversely proportional to the level of Vpass_elevated. Vcgr can also depend on the data states which are being distinguished, such that Vcgr is lower and decreases more quickly when relatively lower data states are being distinguished. See also FIG. 11A. Thus, the magnitude of the slope of Vcgr/Vpass_elevated is higher for the E/A read than for the B/C read.

Figure 11F:
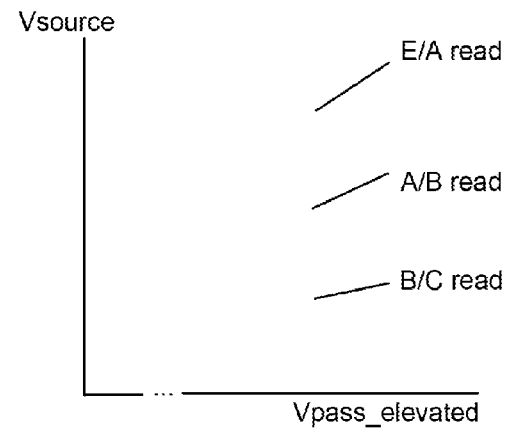
FIG. 11F depicts Vsource during a data recovery read operation for a first set of memory cells on WLLn, as a function of Vpass_elevated, and consistent with FIG. 5A.

FIG. 11F depicts Vsource during a data recovery read operation for a first set of memory cells on WLLn, as a function of Vpass_elevated, and consistent with FIG. 5A. The horizontal axis depicts Vpass_elevated and the vertical axis depicts Vsource. As an alternative to decreasing Vcgr for each read operation, Vsource can be increase. The conductive state of a cell is based on Vcgr-Vsource, so that increasing Vsource is equivalent to decreasing Vcgr. In this case, Vsource is proportional to the level of Vpass_elevated. Vsource can also depend on the data states which are being distinguished, such that Vsource is higher and increases more quickly when relatively lower data states are being distinguished. Thus, the magnitude of the slope of Vsource/Vpass_elevated is higher for the E/A read than for the B/C read.

Figure 11G:
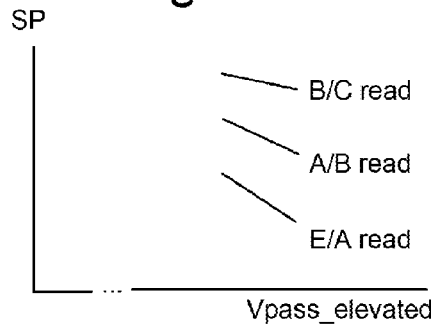
FIG. 11G depicts a sensing period (SP) in sensing circuitry during a data recovery read operation as for a first set of memory cells on WLLn, as a function of Vpass_elevated, and consistent with FIG. 5A.

FIG. 11G depicts a sensing period (SP) in sensing circuitry during a data recovery read operation as for a first set of memory cells on WLLn, as a function of Vpass_elevated, and consistent with FIG. 5A. The horizontal axis depicts Vpass_elevated and the vertical axis depicts SP. As mentioned, the Vt of a cell can be determined by applying different levels of Vcgr to the cell and using sensing circuitry to determine whether the cell is in a conductive state. This approach assume the sensing circuitry uses a consistent sensing process. As an alternative to decreasing Vcgr for each read operation as a function of Vpass_elevated, a sensing period in the sensing circuitry can be reduced in proportion to Vpass_elevated. SP can also depend on the data states which are being distinguished, such that SP is lower and decreases more quickly when relatively lower data states are being distinguished. Details regarding the use of SP in sensing circuitry are discussed further below.

Figure 11H:
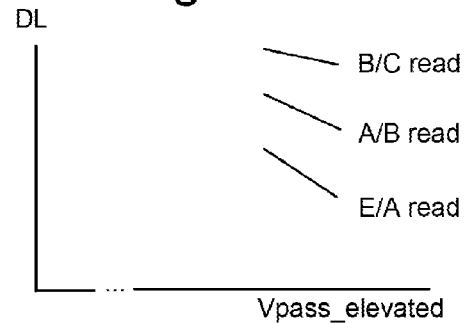
FIG. 11H depicts voltage demarcation level (DL) in sensing circuitry during a data recovery read operation for a first set of memory cells on WLLn, as a function of Vpass_elevated, and consistent with FIG. 5A.

FIG. 11H depicts voltage demarcation level (DL) in sensing circuitry during a data recovery read operation for a first set of memory cells on WLLn, as a function of Vpass_elevated, and consistent with FIG. 5A. The horizontal axis depicts Vpass_elevated and the vertical axis depicts DL. As an alternative to decreasing Vcgr for each read operation as a function of Vpass_elevated, a demarcation level (DL) in the sensing circuitry can be decreased in proportion to Vpass_elevated. DL can also depend on the data states which are being distinguished, such that DL is lower and decreases more quickly when relatively lower data states are being distinguished.

Figure 11I:
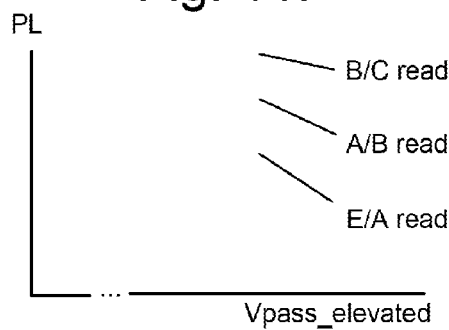
FIG. 11I depicts pre-charge level (PL) in sensing circuitry during a data recovery read operation for a first set of memory cells on WLLn, as a function of Vpass_elevated, and consistent with FIG. 5A.

FIG. 11I depicts pre-charge level (PL) in sensing circuitry during a data recovery read operation for a first set of memory cells on WLLn, as a function of Vpass_elevated, and consistent with FIG. 5A. The horizontal axis depicts Vpass_elevated and the vertical axis depicts PL. As an alternative to decreasing Vcgr for each read operation as a function of Vpass_elevated, a pre-charge level in the sensing circuitry can be increased in proportion to Vpass_elevated. PL can also depend on the data states which are being distinguished, such that PL is lower and decreases more quickly when relatively lower data states are being distinguished. Details regarding the use of PL in sensing circuitry are discussed further below.

In various options, one or more of Vcgr, Vsource, SP, DL or PL can be adjusted in each read operation to compensate for decreases in the Vt of cells on WLLn caused by the use of Vpass_elevated on WLLn+1.

Figure 11J:
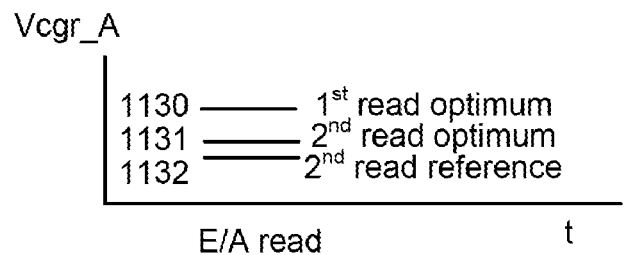
FIG. 11J depicts an optimum Vcgr_A in a first read operation, an optimum Vcgr_A in a second read operation, and a reference Vcgr_A in the second read operation, consistent with FIG. 5A.

FIG. 11J depicts an optimum Vcgr_A in a first read operation, an optimum Vcgr_A in a second read operation, and a reference Vcgr_A in the second read operation, consistent with FIG. 5A. The horizontal axis depicts time and the vertical axis depicts Vcgr_A. As mentioned, an optimum Vcgr for distinguishing between two adjacent data states can be determined adaptively by determining a Vcgr which results in the fewest errors. Typically, this Vcgr is at a minimum in the Vt distribution between the two adjacent data states. This can be done for each read operation. Line 1130 represents an optimum level of Vcgr_A for a first read operation on WLLn, in which Vpass_nominal is applied on WLLn+1. Line 1131 represents an optimum level of Vcgr_A for a second read operation on WLLn, in which an initial level of Vpass_elevated is applied on WLLn+1. Further, line 1132 represents a predetermined reference level of Vcgr_A for the second read operation. This reference level could be determined from testing of different memory devices, or of different WLLs in one memory device. This reference level may represent an expected level for an average memory device or WLL.

However, a given WLL may behave differently from the average. A difference between the reference Vcgr_A and the adaptively determined optimum of Vcgr_A, referred to as delta Vcgr_A, is a function of a degree of sensitivity of the Vt of the cells on WLLn relative to Vpass_elevated on WLLn+1. This is similar to the sensitivity discussed in connection with FIG. 10E.

Delta Vcgr_A is inversely proportional to the sensitivity. It can be useful to adjust the step size for Vpass_elevated so that uniform results are achieved for data recovery operations for different WLLs with different sensitivities. For example, with a higher sensitivity, the step size can be lower. With a lower sensitivity, the step size can be higher. Since line 1131 is higher than line 1132, the sensitivity is lower than average. This means the step size for Vpass_elevated can be adjusted to be higher than when the sensitivity is average.

The above technique can be extended to the Vcgr used for other data states, such as for the A/B and B/C reads. However, the sensitivity, and variations in the sensitivity, will typically be strongest for the E/A read. The above technique could also be extended to later read operations, e.g., third, fourth and so forth. The value of delta Vcgr_A from the second read operation can be used to adjust the step size of Vpass_elevated in the second read operation and optionally, the third, fourth and later read operations. Or, a new value of delta Vcgr_A from the third read operation, for instance, can be used to adjust the step size of Vpass_elevated in the third read operation and optionally, the fourth and later read operations.

Figure 11K:
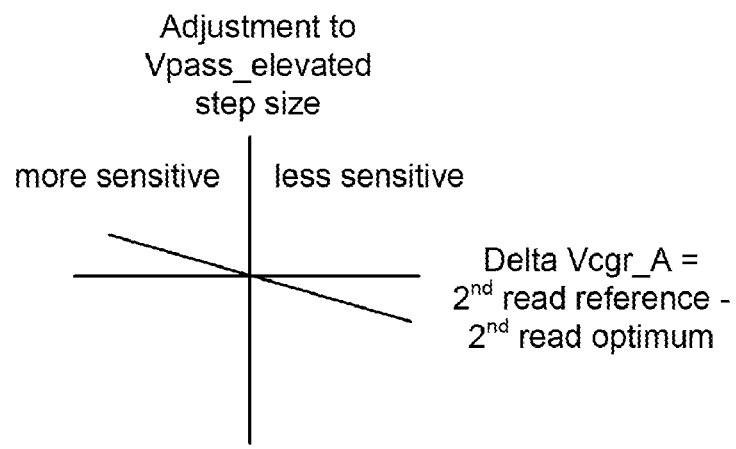
FIG. 11K depicts an adjustment to Vpass_elevated step size as a function of delta Vcgr_A in the second read operation, consistent with FIG. 11J.

FIG. 11K depicts an adjustment to Vpass_elevated step size as a function of delta Vcgr_A in the second read operation, consistent with FIG. 11J. The horizontal axis depicts delta Vcgr_A as discussed in connection with FIG. 11J, e.g., Vcgr_A ($2^{nd}$ read reference)-Vcgr_A ($2^{nd}$ read optimum) and the vertical axis depicts a positive or negative adjustment to Vpass_elevated step size. The origin of the axes represents delta Vcgr_A=0 and adjustment=0. Note that the step size is non-zero regardless of the adjustment. The adjustment is inversely proportional to delta Vcgr_A.

This is an example of a second voltage (Vpass_elevated) being based on a difference between the optimum control gate voltage (line 1131) and a reference control gate voltage (line 1132).

The adjustment of sensing parameters can be understood further in view of the following example sensing circuits and control schemes.

Figure 12A:
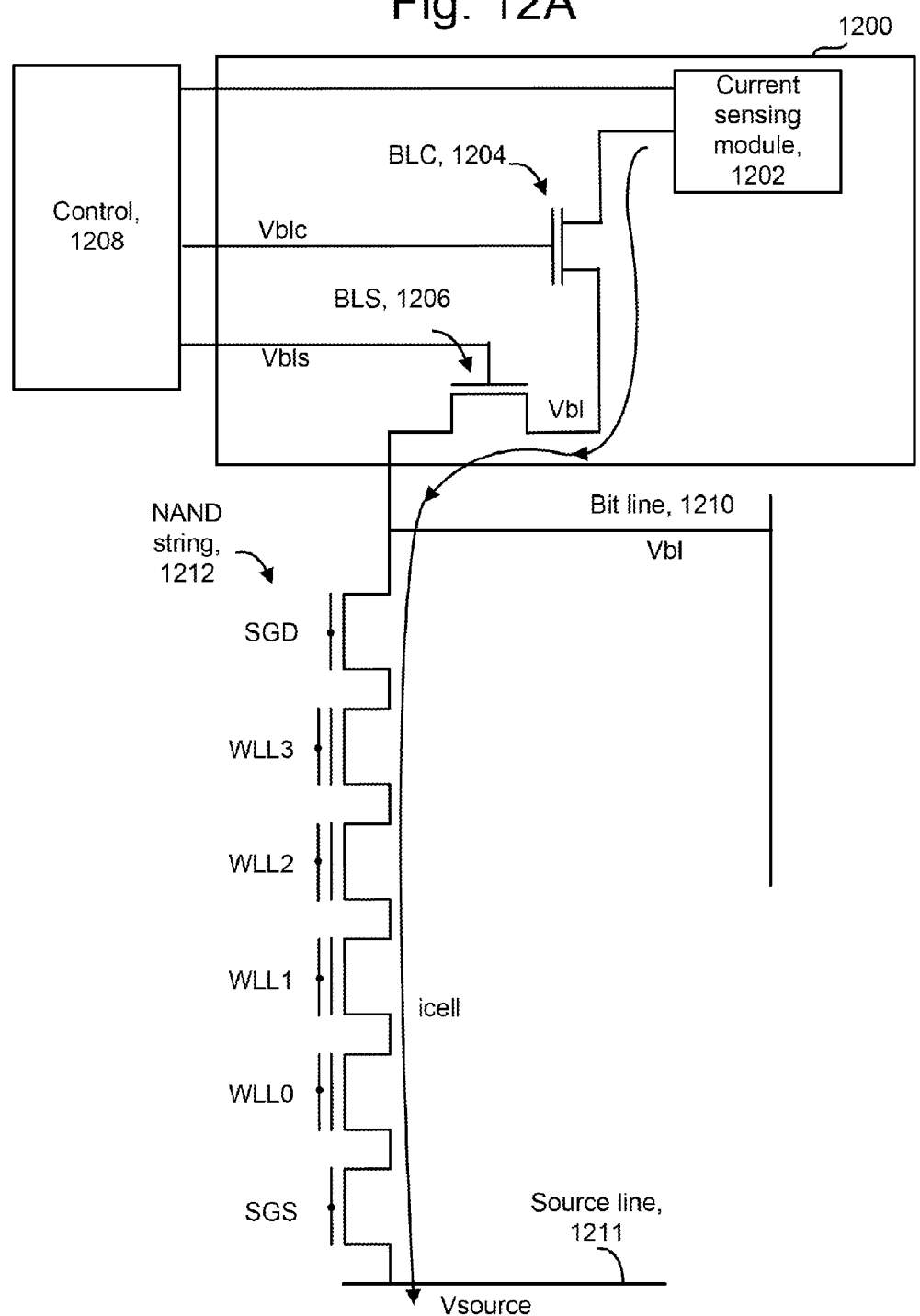
FIG. 12A depicts a configuration of a NAND string and sensing circuitry when current sensing is used.

FIG. 12A depicts a configuration of a NAND string and sensing circuitry when current sensing is used. A simple NAND string 1212 includes four storage elements which are in communication with word lines WL0, WL1, WL2 and WL3, respectively. A bit line 1210 having a voltage Vbl is depicted, in addition to sensing circuitry 1200. A BLS (bit line sense) transistor 1206, coupled to the bit line 1210, is a high voltage transistor, and is made conductive in response to a control 1208 during sense operations. A BLC (bit line clamp) transistor 1204 is a low voltage transistor which is made conductive in response to the control 1208 at a start of a sensing period to allow the bit line to communicate with a current sensing module 1202. During a sense operation, such as a read or verify operation, a pre-charge operation occurs in which a capacitor in the current sensing module 1202 is charged. The BLC transistor 1204 may be made conductive to allow the pre-charging. The pre-charge level in the current sensing module 1202 can be a sensing parameter, for example. The BLC transistor can be used to set a bit line voltage as Vbl=Vblc–Vth, where the Vth is of the BLC transistor. The selected word line receives a read or verify control gate voltage, and Vsource is set.

At the drain side of the NAND string 1230, the BLS transistor 1210 is made conductive. Additionally, Vblc is applied to the BLC transistor 1204 to allow the current sensing module 1202 to communicate with the bit line. The pre-charged capacitor in the current sensing module 1202 discharges through the bit line and into the source so that the source acts as a current sink. The pre-charged capacitor at the drain of the NAND string may be pre-charged to a potential which exceeds a potential of the source so that a current flows through the selected non-volatile storage element and sinks into the source when the selected storage element is in the conductive state.

Vsource is provided on a source line 1211.

If the selected storage element is in a conductive state due to the application of the control gate verify or read voltage, a relatively high current will flow in the NAND string. If the selected storage element is in a non-conductive state, no or relatively little current will flow. The current sensing module 1202 can sense the cell/storage element current, icell. In one possible approach, the current sensing module determines a voltage drop which is tied to a fixed current flow by the relationship $\Delta V = i \cdot t / C$, where $\Delta V$ is the voltage drop, i is the fixed current, t is a discharge/sensing time period and C is the capacitance of the pre-charged capacitor in the current sensing module. The sensing period can be an adjustable sensing parameter, as discussed.

Figure 12B:
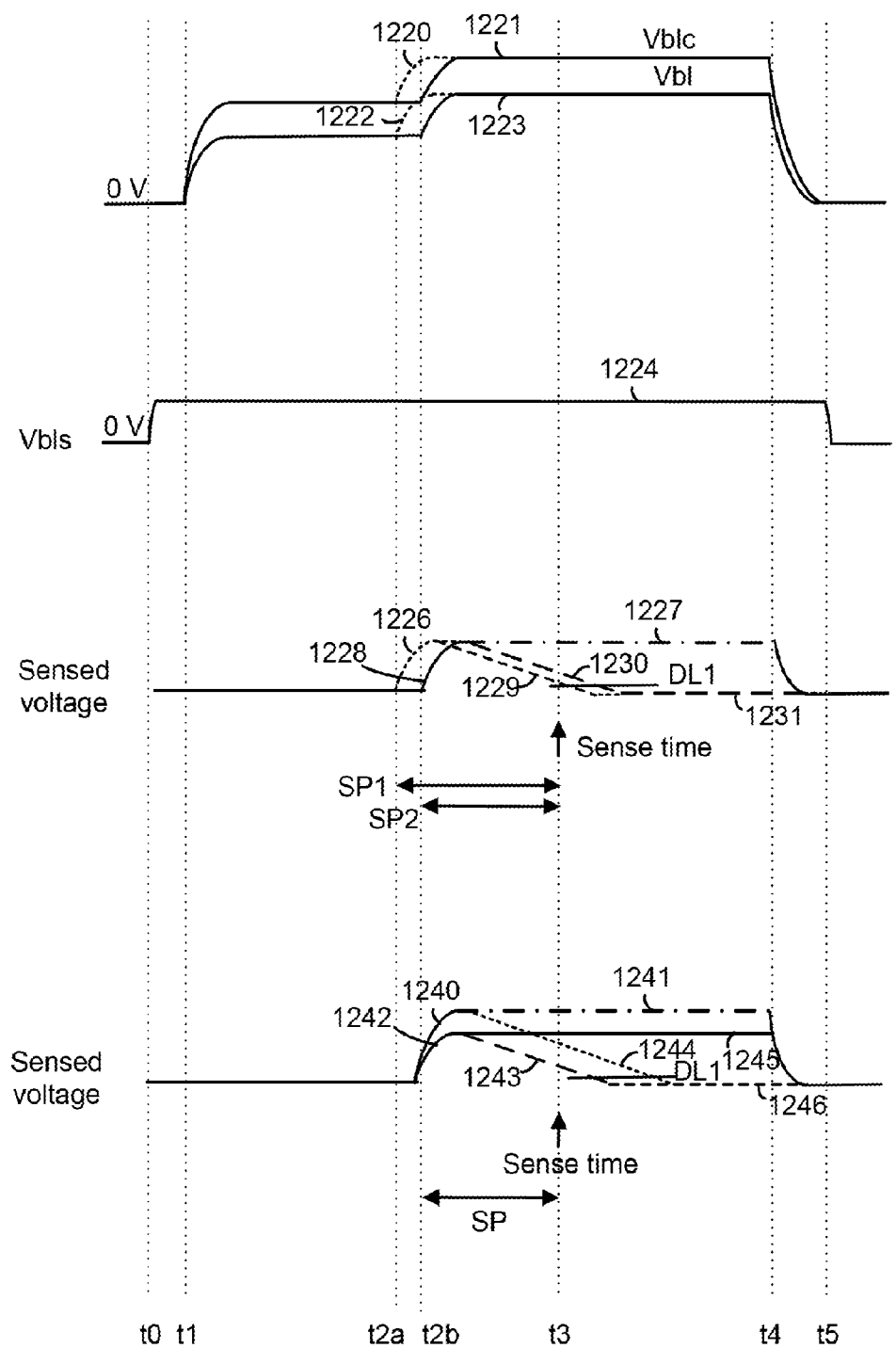
FIG. 12B depicts waveforms associated with FIG. 12A.
Figure 12C:
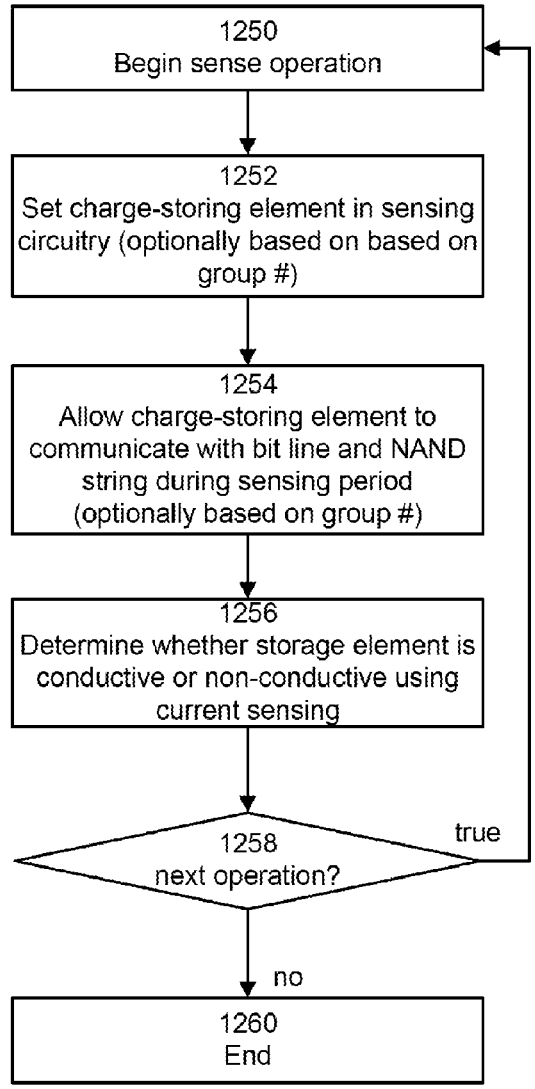
FIG. 12C depicts a sensing process which applies to the current sensing circuitry of FIG. 12A or the voltage sensing circuitry of FIG. 12A.
Figure 12D:
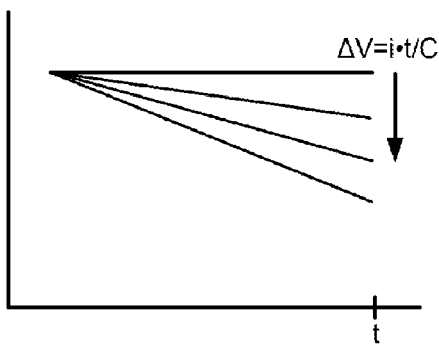
FIG. 12D depicts a voltage drop with time for different lines of fixed current.

See also FIG. 12D, which depicts a voltage drop with time for different lines of fixed current. The greater voltage drops represent higher currents. At the end of the sensing period, since i and C are fixed, $\Delta V$ for a given current can be determined. In one approach, a p-MOS transistor is used to determine a level of $\Delta V$ relative to a demarcation value. In another possible approach, a cell current discriminator serves as a discriminator or comparator of current levels by determining whether the conduction current is higher or lower than a given demarcation current.

The current sensing module 1202 thus can determine whether the selected storage element is in a conductive or non-conductive state by the level of current. Generally, a higher current will flow when the selected storage element is in a conductive state and a lower current will flow when the selected storage element is in a non-conductive state. A Vth of the selected storage element is above or below the control gate voltage, such as a verify level or a read level, when it is in a non-conductive state or a conductive state, respectively.

FIG. 12B depicts waveforms associated with FIG. 12A. In one approach, different sensing periods are used, and a fixed pre-charge level is used. Waveform 1220 depicts Vblc and waveform 1222 depicts Vbl, when a longer sensing period (sensing period1) is used. Waveform 1221 depicts Vblc and waveform 1223 depicts Vbl, when a shorter sensing period (sensing period2) is used. Waveform 1224 depicts Vbls.

Waveforms 1226 and 1227 depict a sense voltage when the longer sensing period is used, and a sensed storage element is non-conductive. Waveforms 1226 and 1229 depict a sense voltage when the longer sensing period is used, and a sensed storage element is conductive. Waveforms 1228 and 1227 depict a sense voltage when the shorter sensing period is used, and a sensed storage element is non-conductive. Waveforms 1228 and 1230 depict a sense voltage when the shorter sensing period is used, and a sensed storage element is conductive. Waveform 1231 depicts a discharge level.

Vbl increases with Vblc between t1 and t2. At t2, the pre-charged capacitor is discharged. In practice, after rising, Vbl will drop slightly (not shown) if current flows in the NAND string. For example, Vbl may rise to 1 V when Vblc=2 V and the Vth of the BLC transistor is 1 V. When sensing, if current flows, Vbl may drop from 1 V to 0.9 V, for instance. Thus, the capacitor can start to discharge at t2a when the longer sensing period is used, or at t2b when the shorter sensing period is used. t3 is a sense time, at an end of the sensing or discharge period. A determination can be made at t3 as to whether the sensed voltage exceeds a demarcation level. It can be concluded that the selected storage element is conductive when the voltage drops below the demarcation level (DL1), or that the selected storage element is non-conductive if the voltage does not drop below the demarcation level.

In another approach, a fixed sensing period is used, but different pre-charge levels are used. Waveforms 1240 and 1241 depict a sense voltage when a higher pre-charge level is used, and a sensed storage element is non-conductive. Waveforms 1240 and 1244 depict a sense voltage when the higher pre-charge level is used, and the sensed storage element is conductive. Waveforms 1242 and 1245 depict a sense voltage when a lower pre-charge level is used, and a sensed storage element is non-conductive. Waveforms 1242 and 1243 depict a sense voltage when the lower pre-charge level is used, and a sensed storage element is conductive. Waveform 1246 depicts a discharge level. The demarcation level (DL1) is also depicted.

FIG. 12C depicts a sensing process which applies to the current sensing circuitry of FIG. 12A or the voltage sensing circuitry of FIG. 12A. A sense operation, such as a read or verify operation, begins at step 1250. Step 1252 includes setting a charge-storing element in the sensing circuitry to a desired level which is optionally based on a group number of the storage element being sensed in the associated NAND string. Step 1254 includes allowing the charge-storing element to communicate with the bit line and the NAND string during a sensing period which is optionally based on the group number. Step 1256 includes determining whether the storage element is conductive or non-conductive using current sensing. If another sense operation is to be performed, at decision step 1258, the control flow continues at step 1250. Otherwise, the process ends at step 1260. As mentioned, one or more sensing parameters can be adjusted in the sensing operation.

In another approach, voltage sensing can be used. Note that the terms "current sensing" and "voltage sensing" are used informally since both can involve sensing a voltage. In contrast to current sensing, voltage sensing does not involve sensing a voltage drop which is tied to a fixed current. Instead, voltage sensing involves determining whether charge sharing occurs between a capacitor in a voltage sensing module and a capacitance of the bit line. Current is not fixed or constant during the sensing. Little or no charge sharing occurs when the selected storage element is conductive, in which case the voltage of the capacitor in the voltage sensing module does not drop significantly. Charge sharing occurs when the selected storage element is non-conductive, in which case the voltage of the capacitor in the voltage sensing module drops significantly.

Figure 13A:
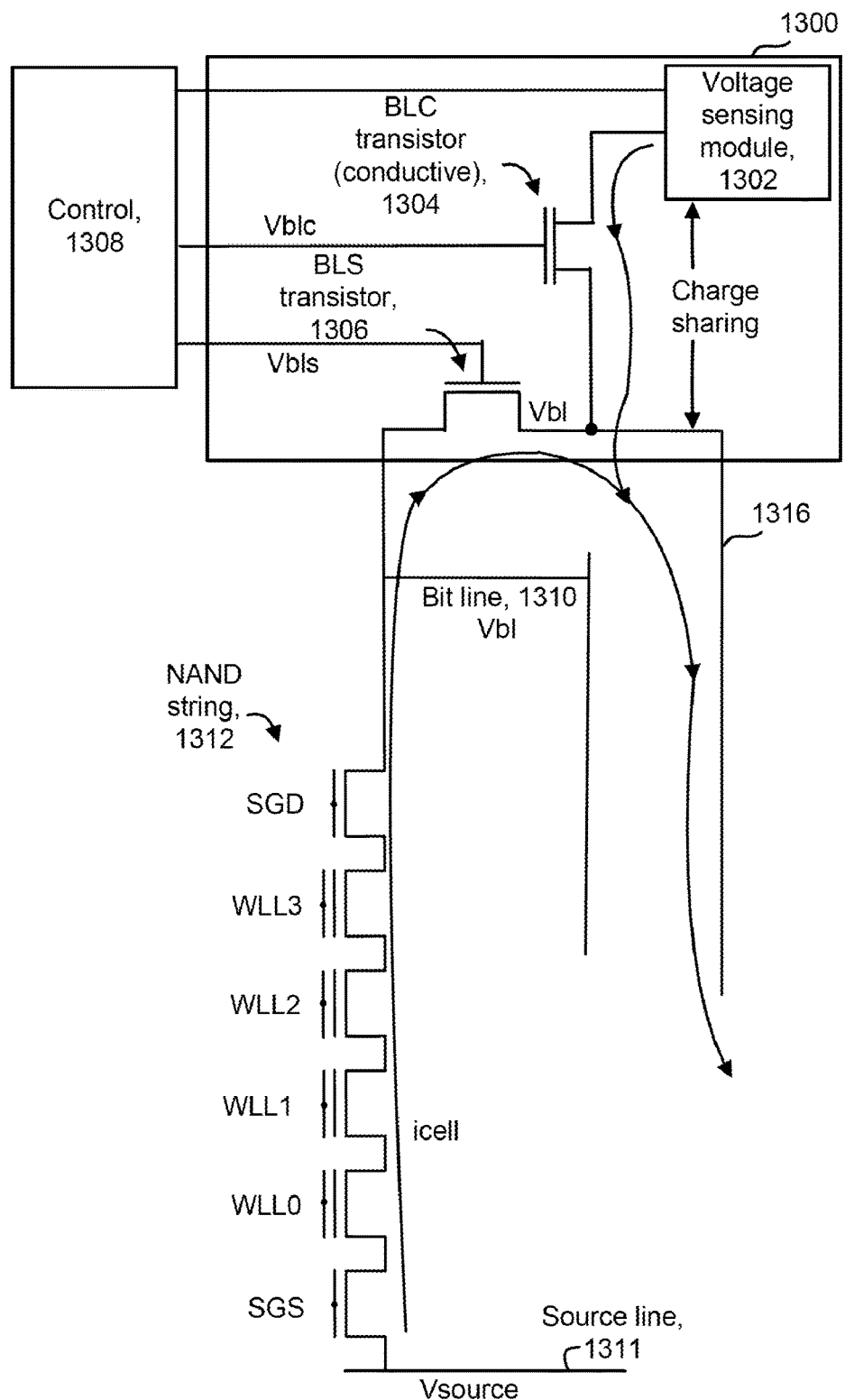
FIG. 13A depicts a configuration of a NAND string and sensing circuitry when voltage sensing is used.

FIG. 13A depicts a configuration of a NAND string and sensing circuitry when voltage sensing is used. An example NAND string 1312 includes four storage elements which are in communication with word lines WL0, WL1, WL2 and WL3, respectively. A bit line 1310 having a voltage Vbl is depicted, in addition to sensing circuitry 1300. A BLS transistor 1306, which is initially conductive, is coupled to the bit line 1310 via a sense node 1314. The BLS transistor 1306 is a high voltage transistor, and is made conductive in response to a control 1308 during sense operations. A BLC transistor 1304, which is non-conductive initially, is a low voltage transistor which is made conductive in response to the control 1308 to allow the bit line to communicate with a voltage sensing module/circuit 1302. During a sense operation, such as a read or verify operation, a pre-charge operation occurs in which a capacitor in the voltage sensing module 1302 is charged. The BLC transistor 1304 may be made conductive to allow the pre-charging. The pre-charge level of a charge-storing element in the voltage sensing module 1302 can be an adjustable sensing parameter as discussed.

During sensing, the bit line will charge up to a level which is based on the Vth of the selected storage element, and a body effect. After a certain amount of time, all the bit lines reach their DC levels, and the BLC transistor 1304 is made conductive to allow charge sharing between the voltage sensing module 1302 and the sense node 1314 so that voltage sensing of the threshold voltage of the selected storage element can occur. The voltage sensing module 1302 may perform voltage sensing as part of a reading or verifying operation, for instance.

When voltage sensing occurs, the BLC transistor 1304 is made conductive so that current flows from the voltage sensing module 1302 toward the discharge path 1316, in addition to the current being discharged from the NAND string 1312 flowing toward the discharge path 1316.

Vsource is provided on a source line 1311.

FIG. 13B depicts waveforms associated with FIG. 13A. Waveform 1300 depicts Vsource, and waveform 1302 depicts Vbls. Waveform 1304 depicts Vblc when a longer sensing period (sensing period1) is used, and waveform 1306 depicts Vblc when a shorter sensing period (sensing period2) is used. In one approach, different sensing periods are used while a fixed pre-charge level is used. Waveform 1314 depicts a sensed voltage when the shorter or longer sensing period is used and the sensed storage element is non-conductive. Waveform 1310 depicts a sensed voltage when the longer sensing period is used and the sensed storage element is conductive. Waveform 1 depicts a sensed voltage when the shorter sensing period is used and the sensed storage element is conductive. Waveform 1316 depicts a discharge level. A demarcation level (DL2) is also depicted. The longer sensing period extends between t3a and t4, while the shorter sensing period extends between t3b and t4.

In another approach, a fixed sensing period is used while different pre-charge levels are used. Waveform 1322 depicts a sensed voltage when a higher pre-charge level is used and the sensed storage element is conductive. Waveform 1320 depicts a sensed voltage when a lower pre-charge level is used and the sensed storage element is conductive. Waveform 1326 depicts a sensed voltage when the higher pre-charge level is used and the sensed storage element is non-conductive. Waveform 1324 depicts a sensed voltage when the lower pre-charge level is used and the sensed storage element is non-conductive. A demarcation level (DL2) is also depicted.

As mentioned, during voltage sensing, charge sharing between the voltage sensing module and the bit line occurs when the selected storage element is non-conductive. This charge sharing lowers the sensed voltage at the voltage sensing module. Little or no charge sharing between the voltage sensing module and the bit line occurs when the selected storage element is conductive so that the sensed voltage at the voltage sensing module remains high.

At t0, Vbls increases so that the BLS transistor is conductive. At t1, Vsource is applied as a common source voltage for a set of NAND strings. At t3a or t3b, the BLC transistor is made conductive by increasing Vblc as depicted by waveform 1304 or 1306, respectively, thereby starting the sensing period. The voltage sensing components may use a voltage demarcation level DL2 at a specified sense time t4, at the end of the sensing period, to determine whether the selected storage element is conductive or non-conductive.

Vsource is lowered at t5 and the BLS transistor is made non-conductive at t6, indicating the end of the sense operation. The selected word line receives a read or verify control gate voltage while the unselected word lines can receive read pass voltages according to the particular sensing scheme.

Accordingly, it can be seen that, in one embodiment, a method for reading in a memory device comprises: programming a first set of memory cells connected to one word line layer (WLLn) in a set of word line layers in a memory structure; subsequently programming a second set of memory cells connected to another word line layer (WLLn+1) in the set of word line layers which is adjacent to the one word line layer, where each respective memory cell of the first set of memory cells is adjacent to, and is arranged along a common charge trapping layer with, a respective memory cell of the second set of memory cells; subsequently, in a first read operation, reading data from the first set of memory cells, the first read operation attempts to distinguish between adjacent data states stored by the first set of memory cells, the first read operation biases the another word line layer at a first voltage; determining that the data read in the first read operation comprises one or more uncorrectable errors; and in response to the determining that the data read in the first read operation comprises one or more uncorrectable errors, reading data from the first set of memory cells in a second read operation, the second read operation attempts to distinguish between the adjacent data states, the second read operation biases the another word line layer at a second voltage which is higher than the first voltage, and compensates for lower threshold voltages of the first set of memory cells in the second read operation relative to the first read operation.

In another embodiment, a memory device comprises: a first set of memory cells connected to one word line layer (WLLn) in a set of word line layers in a memory structure; a second set of memory cells connected to another word line layer (WLLn+1) in the set of word line layers, the another word line layer is adjacent to the one word line layer, and each respective memory cell of the first set of memory cells is adjacent to, and is arranged along a common charge trapping layer with, a respective memory cell of the second set of memory cells; and a control circuit. The control circuit: programs the first set of memory cells; subsequently programs the second set of memory cells; subsequently, in a first read operation, reads data from the first set of memory cells by attempting to distinguish between adjacent data states stored by the first set of memory cells, the first read operation attempts to distinguish between adjacent data states stored by the first set of memory cells, the first read operation biases the another word line layer at a first voltage; makes a determination that the data read in the first read operation comprises one or more uncorrectable errors; and in response to the determination that the data read in the first read operation comprises one or more uncorrectable errors, reads data from the first set of memory cells in a second read operation, the second read operation attempts to distinguish between the adjacent data states, the second read operation biases the another word line layer at a second voltage which is higher than the first voltage, and compensates for lower threshold voltages of the first set of memory cells in the second read operation relative to the first read operation.

In another embodiment, a method for reading in a memory device comprises: programming a first set of memory cells connected to one word line layer (WLLn) in a set of word line layers in a memory structure; subsequently programming a second set of memory cells connected to another word line layer (WLLn+1) in the set of word line layers, adjacent to the one word line layer, where each respective memory cell of the first set of memory cells is adjacent to, and is arranged along a common charge trapping layer with, a respective memory cell of the second set of memory cells; subsequently, in a first read operation, reading data from the first set of memory cells by attempting to distinguish between adjacent data states stored by the first set of memory cells while biasing the another word line layer with a first voltage; performing error correction decoding on the data read in the first read operation; determining from the error correction decoding on the data read in the first read operation that the data read in the first read operation comprises one or more uncorrectable errors; and in response to the determining that the data read in the first read operation comprises one or more uncorrectable errors, performing a plurality of additional read operations for the first set of memory cells until data read from the first set of memory cells comprises no uncorrectable errors, or until a maximum allowable voltage has been applied to the another word line layer, each read operation of the plurality of additional read operations attempts to distinguish between the adjacent data states while biasing the another word line layer at a progressively higher voltage.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:

1. A method for reading in a memory device, comprising:
   programming a first set of memory cells to a plurality of data states comprising lower data states and higher data states, wherein the first set of memory cells is connected to one word line layer in a set of word line layers in a memory structure;
   subsequently programming a second set of memory cells connected to another word line layer in the set of word line layers which is adjacent to the one word line layer, where each respective memory cell of the first set of memory cells is adjacent to, and is arranged along a common charge trapping layer with, a respective memory cell of the second set of memory cells;
   subsequently, in a first read operation, reading data from the first set of memory cells, the first read operation attempts to distinguish between the lower data states by biasing the one word line layer at a voltage for distinguishing between the lower data states while biasing the another word line layer with a pass voltage, and attempts to distinguish between the higher data states by biasing the one word line layer at a voltage for distinguishing between the higher data states while biasing the another word line layer with a pass voltage;
   determining that the data read in the first read operation comprises one or more uncorrectable errors; and
   in response to the determining that the data read in the first read operation comprises one or more uncorrectable errors, reading data from the first set of memory cells in a second read operation, the second read operation attempts to distinguish between the lower data states by biasing the one word line layer at a voltage for distinguishing between the lower data states while biasing the another word line layer with a pass voltage, and attempts to distinguish between the higher data states by biasing the one word line layer at a voltage for distinguishing between the higher data states while biasing the another word line layer with a pass voltage, wherein:
   an amount by which the voltage for distinguishing between the lower data states in the first read operation exceeds the voltage for distinguishing between the lower data states in the second read operation, is greater than an amount by which the voltage for distinguishing between the higher data states in the first read operation exceeds the voltage for distinguishing between the higher data states in the second read operation; and
   an amount by which the pass voltage during the distinguishing between the lower data states in the second read operation exceeds the pass voltage during the distinguishing between the lower data states in the first read operation is greater than an amount by which the pass voltage during the distinguishing between the higher data states in the second read operation exceeds the pass voltage during the distinguishing between the higher data states in the first read operation.

2. The method of claim 1, further comprising:
   providing a source voltage for the first set of memory cells which is higher in the second read operation than in the first read operation.

3. The method of claim 1, further comprising:
providing a sensing period which is shorter in the second read operation than in the first read operation, the sensing period is used by sensing circuitry which is connected to the first set of memory cells.

4. The method of claim 1, further comprising:
providing a pre-charge level which is lower in the second read operation than in the first read operation, the pre-charge level is used by sensing circuitry which is connected to the first set of memory cells.

5. The method of claim 1, wherein:
the pass voltage during the distinguishing between the lower data states in the first read operation exceeds the pass voltage during the distinguishing between the higher data states in the first read operation; and
the pass voltage during the distinguishing between the lower data states in the second read operation exceeds the pass voltage during the distinguishing between the higher data states in the second read operation.

6. The method of claim 1, further comprising:
determining that the data read in the second read operation comprises one or more uncorrectable errors; and
in response to the determining that the data read in the second read operation comprises one or more uncorrectable errors, reading data from the first set of memory cells in a third read operation, the third read operation attempts to distinguish between the lower data states by biasing the one word line layer at a voltage for distinguishing between the lower data states while biasing the another word line layer with a pass voltage, and attempts to distinguish between the higher data states by biasing the one word line layer at a voltage for distinguishing between the higher data states while biasing the another word line layer with a pass voltage, wherein:
an amount by which the voltage for distinguishing between the lower data states in the second read operation exceeds the voltage for distinguishing between the lower data states in the third read operation, is greater than an amount by which the voltage for distinguishing between the higher data states in the second read operation exceeds the voltage for distinguishing between the higher data states in the third read operation; and
an amount by which the pass voltage during the distinguishing between the lower data states in the third read operation exceeds the pass voltage during the distinguishing between the lower data states in the second read operation is greater than an amount by which the pass voltage during the distinguishing between the higher data states in the third read operation exceeds the pass voltage during the distinguishing between the higher data states in the second read operation.

7. The method of claim 1, further comprising:
the determining that the data read in the first read operation comprises one or more uncorrectable errors comprises performing error correction decoding on the data read in the first read operation, the error correction decoding indicates a number of errors in the data read in the first read operation; and
setting the voltage for distinguishing between the lower data states in the second read operation in proportion to the number of errors indicated by error correction decoding.

8. The method of claim 1, wherein:
in the first read operation, a plurality of control gate voltages are applied to the one word line layer;
error correction decoding is performed on data read from the first set of memory cells for each control gate voltage of the plurality of control gate voltages;
an optimum control gate voltage which results in a minimum number of errors is selected from among the plurality of control gate voltages; and
the voltage for distinguishing between the lower data states in the second read operation is based on a difference between the optimum control gate voltage and a reference control gate voltage.

9. The method of claim 1, further comprising:
in response to the determining that the data read in the first read operation comprises one or more uncorrectable errors, copying data from the second set of memory cells to a backup location in the memory structure, before the reading in the second read operation.

10. The method of claim 1, wherein:
the memory structure comprises a three-dimensional stacked memory structure in which the one word line layer is separated from the another word line layer by a dielectric layer; and
the programming of the first set of memory cells and the programming of the second set of memory cells forms a parasitic memory cell in the common charge trapping layer adjacent to the dielectric layer and between the one word line layer and the another word line layer.

11. An apparatus, comprising:
a first set of memory cells connected to one word line layer in a set of word line layers in a memory structure;
a second set of memory cells connected to another word line layer in the set of word line layers, the another word line layer is adjacent to the one word line layer, and each respective memory cell of the first set of memory cells is adjacent to, and is arranged along a common charge trapping layer with, a respective memory cell of the second set of memory cells; and
a control circuit, the control circuit is configured to:
program the first set of memory cells to a plurality of data states comprising lower data states and higher data states;
subsequently program the second set of memory cells;
subsequently, in a first read operation, read data from the first set of memory cells by, the first read operation attempts to distinguish between the lower data states by biasing the one word line layer at a voltage for distinguishing between the lower data states while biasing the another word line layer with a pass voltage, and attempts to distinguish between the higher data states by biasing the one word line layer at a voltage for distinguishing between the higher data states while biasing the another word line layer with a pass voltage;
make a determination that the data read in the first read operation comprises one or more uncorrectable errors; and
in response to the determination that the data read in the first read operation comprises one or more uncorrectable errors, read data from the first set of memory cells in a second read operation, the second read operation attempts to distinguish between the lower data states by biasing the one word line layer at a voltage for distinguishing between the lower data states while biasing the another word line layer with a pass voltage, and attempts to distinguish between the higher data states by biasing the one word line layer at a voltage for distinguishing between the higher data states while biasing the another word line layer with a pass voltage, wherein:

an amount by which the voltage for distinguishing between the lower data states in the first read operation exceeds the voltage for distinguishing between the lower data states in the second read operation, is greater than an amount by which the voltage for distinguishing between the higher data states in the first read operation exceeds the voltage for distinguishing between the higher data states in the second read operation; and an amount by which the pass voltage during the distinguishing between the lower data states in the second read operation exceeds the pass voltage during the distinguishing between the lower data states in the first read operation is greater than an amount by which the pass voltage during the distinguishing between the higher data states in the second read operation exceeds the pass voltage during the distinguishing between the higher data states in the first read operation.

12. The apparatus of claim 11, wherein:
the control circuit is configured to provide at least one of a source voltage, sensing period, a demarcation level or a pre-charge level which is different in the second read operation than in the first read operation.

13. A method for reading in a memory device, comprising:
programming a first set of memory cells connected to one word line layer in a set of word line layers in a memory structure;
subsequently programming a second set of memory cells connected to another word line layer in the set of word line layers, adjacent to the one word line layer, where each respective memory cell of the first set of memory cells is adjacent to, and is arranged along a common charge trapping layer with, a respective memory cell of the second set of memory cells;
subsequently, in a first read operation, reading data from the first set of memory cells by attempting to distinguish between adjacent data states stored by the first set of memory cells while biasing the another word line layer with a first voltage;
performing error correction decoding on the data read in the first read operation;
determining from the error correction decoding on the data read in the first read operation a number of errors in the data read in the first read operation, and that the data read in the first read operation comprises one or more uncorrectable errors;
in response to the determining that the data read in the first read operation comprises one or more uncorrectable errors, performing a plurality of additional read operations including second and third read operations, for the first set of memory cells until data read from the first set of memory cells comprises no uncorrectable errors, wherein each read operation of the plurality of additional read operations attempts to distinguish between the adjacent data states by biasing the one word line layer with a control gate voltage while biasing the another word line layer with a pass voltage, the control gate voltage becomes progressively lower in each read operation of the plurality of additional read operations, and the pass voltage becomes progressively higher in each read operation of the plurality of additional read operations;

during the second read operation, setting the pass voltage progressively higher voltage in proportion to the number of errors of the data read in the first read operation;
performing error correction decoding on data read from the first set of memory cells in the second read operation to determine a number of errors in the data read in the second read operation; and
during the third read operation, setting the pass voltage progressively higher voltage in proportion to the number of errors in the second read operation.

14. The method of claim 13, wherein:
the pass voltage becomes progressively higher in each read operation of the plurality of additional read operations according to a step size; and
the step size is relatively higher when the adjacent data states are relatively lower data states among a plurality of data states.

15. The method of claim 13, wherein:
the control gate voltage becomes progressively lower in each read operation of the plurality of additional read operations according to step size; and
the step size is relatively higher when the adjacent data states are relatively lower data states among a plurality of data states.

16. An apparatus, comprising:
means for programming a first set of memory cells to a plurality of data states comprising two lowest data states and two highest data states, wherein the first set of memory cells is connected to one word line layer in a set of word line layers in a memory structure;
means for subsequently programming a second set of memory cells connected to another word line layer in the set of word line layers, adjacent to the one word line layer, where each respective memory cell of the first set of memory cells is adjacent to, and is arranged along a common charge trapping layer with, a respective memory cell of the second set of memory cells;
means for subsequently, in a first read operation, reading data from the first set of memory cells to distinguish between the two lowest data states by biasing the one word line layer at a voltage for distinguishing between the two lowest data states while biasing the another word line layer with a pass voltage, and reading data to distinguish between the two highest data states by biasing the one word line layer at a voltage for distinguishing between the two highest data states while biasing the another word line layer with a pass voltage;
means for performing error correction decoding on the data read in the first read operation; and
means for, based on the error correction decoding, and in a second read operation, reading data from the first set of memory cells to distinguish between the two lowest data states by biasing the one word line layer at a voltage for distinguishing between the two lowest data states while biasing the another word line layer with a pass voltage, and reading data to distinguish between the two highest data states by biasing the one word line layer at a voltage for distinguishing between the two highest data states while biasing the another word line layer with a pass voltage, wherein:
an amount by which the voltage for distinguishing between the two lowest data states in the first read operation exceeds the voltage for distinguishing between the two lowest data states in the second read operation, is greater than an amount by which the voltage for distinguishing between the two highest data states in the first read operation exceeds the voltage for distinguishing between the two highest data states in the second read operation; and an amount by which the pass voltage during the distinguishing between the two lowest data states in the second read operation exceeds the pass voltage during the distinguishing between the two lowest data states in the first read operation is greater than an amount by which the pass voltage during the distinguishing between the two highest data states in the second read operation exceeds the pass voltage during the distinguishing between the two highest data states in the first read operation.

17. The apparatus of claim 11, wherein:

the memory structure comprises a three-dimensional stacked memory structure in which the one word line layer is separated from the another word line layer by a dielectric layer; and a parasitic memory cell is provided in the common charge trapping layer adjacent to the dielectric layer and between the one word line layer and the another word line layer.

18. The method of claim 13, wherein:

the memory structure comprises a three-dimensional stacked memory structure in which the one word line layer is separated from the another word line layer by a dielectric layer; and a parasitic memory cell is provided in the common charge trapping layer adjacent to the dielectric layer and between the one word line layer and the another word line layer.

19. The apparatus of claim 16, wherein:

the memory structure comprises a three-dimensional stacked memory structure in which the one word line layer is separated from the another word line layer by a dielectric layer; and a parasitic memory cell is provided in the common charge trapping layer adjacent to the dielectric layer and between the one word line layer and the another word line layer.

* * * * *